United States Patent
Thomsen et al.

(10) Patent No.: US 10,528,700 B2
(45) Date of Patent: Jan. 7, 2020

(54) INDUSTRIAL AUTOMATION INFORMATION CONTEXTUALIZATION METHOD AND SYSTEM

(71) Applicant: Rockwell Automation Technologies, Inc., Mayfield Heights, OH (US)

(72) Inventors: Joachim Thomsen, Krefeld (DE); Stephen C. Briant, Moon Township, PA (US); Noel Henderson, Milton, FL (US); Manuel Sukerman, Chicago, IL (US); Daniel B. Seger, Kennesaw, GA (US); Scott N. Sandler, Chagrin Falls, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 194 days.

(21) Appl. No.: 15/489,091

(22) Filed: Apr. 17, 2017

(65) Prior Publication Data
US 2018/0300437 A1    Oct. 18, 2018

(51) Int. Cl.
*G06F 17/50* (2006.01)
*G06F 17/21* (2006.01)
(Continued)

(52) U.S. Cl.
CPC ....... *G06F 17/509* (2013.01); *G05B 19/4183* (2013.01); *G06F 16/248* (2019.01);
(Continued)

(58) Field of Classification Search
CPC ............. G06F 17/509; G06F 16/24573; G06F 17/218; G06F 16/248; G05B 13/04
(Continued)

(56) References Cited

U.S. PATENT DOCUMENTS 6,421,571 B1 * 7/2002 Spriggs ................. G05B 15/02
                                                          345/629
8,031,638 B2   10/2011 Ackermann et al.
(Continued)

FOREIGN PATENT DOCUMENTS

| CN | 103217935 A | 7/2013 |
| CN | 103685442 A | 3/2014 |

(Continued)

OTHER PUBLICATIONS

Final Office Action received for U.S. Appl. No. 15/609,301 dated May 22, 2019, 35 pages.
(Continued)

*Primary Examiner* — Andre Pierre Louis
*Assistant Examiner* — Faraj Ayoub
(74) *Attorney, Agent, or Firm* — Amin, Turocy & Watson, LLP

(57) ABSTRACT

An industrial data presentation system leverages structured data types defined on industrial devices to generate and deliver meaningful presentations of industrial data. Industrial devices are configured to support structured data types referred to as basic information data types (BIDTs) comprising a finite set of structured information data types, including a rate data type, a state data type, an odometer data type, and an event data type. The BIDTs are discoverable by a gateway device on which models of industrial assets can be defined, where the models reference the BIDTs defined on the industrial devices. The gateway device can retrieve industrial data from the data tags, formatted in accordance with the data types and associated user-defined metadata specific to the respective data types. The gateway device or a separate application server system can then generate graphical presentations of the industrial data in accordance with the model and the metadata.

20 Claims, 24 Drawing Sheets

(51) Int. Cl.
*G06F 16/2457* (2019.01)
*G06F 16/248* (2019.01)
*G05B 19/418* (2006.01)

(52) U.S. Cl.
CPC ...... *G06F 16/24573* (2019.01); *G06F 17/218* (2013.01); *G05B 2219/31288* (2013.01)

(58) Field of Classification Search
USPC .......................................................... 703/6
See application file for complete search history.

(56) References Cited

U.S. PATENT DOCUMENTS

| | | | |
|---|---|---|---|
| 8,674,993 | B1 | 3/2014 | Fleming et al. |
| 9,329,751 | B2 | 5/2016 | Bardhan |
| 9,645,979 | B2 | 5/2017 | Shinzato |
| 9,760,601 | B2 | 9/2017 | Burke et al. |
| 10,048,995 | B1 | 8/2018 | Dikhit et al. |
| 2006/0161597 | A1* | 7/2006 | Ougarov ............... G06F 16/27 |
| 2007/0094181 | A1 | 4/2007 | Tayebnejab et al. |
| 2008/0114474 | A1 | 5/2008 | Campbell et al. |
| 2009/0228176 | A1 | 9/2009 | Mintah et al. |
| 2010/0292825 | A1 | 11/2010 | Taylor et al. |
| 2013/0124465 | A1 | 5/2013 | Pingel et al. |
| 2013/0212420 | A1 | 8/2013 | Lawson et al. |
| 2014/0047107 | A1 | 2/2014 | Maturana et al. |
| 2014/0222522 | A1 | 8/2014 | Chait |
| 2014/0226460 | A1 | 8/2014 | Kretschmann et al. |
| 2014/0335480 | A1 | 11/2014 | Asenjo et al. |
| 2014/0337000 | A1 | 11/2014 | Asenjo et al. |
| 2014/0337429 | A1 | 11/2014 | Asenjo et al. |
| 2015/0120009 | A1 | 4/2015 | Kilian |
| 2015/0277406 | A1 | 10/2015 | Maturana et al. |
| 2015/0281356 | A1 | 10/2015 | Maturana et al. |
| 2015/0316904 | A1 | 11/2015 | Govindaraj et al. |
| 2016/0179599 | A1 | 6/2016 | Deshpande et al. |
| 2016/0299999 | A1* | 10/2016 | James ............... G06F 17/5009 |
| 2017/0351241 | A1 | 12/2017 | Bowers et al. |

FOREIGN PATENT DOCUMENTS

| | | |
|---|---|---|
| EP | 2 592 812 A1 | 5/2013 |
| EP | 2 801 935 A1 | 11/2014 |
| EP | 3 018 596 A1 | 5/2016 |

OTHER PUBLICATIONS

Final Office Action received for U.S. Appl. No. 15/609,323 dated May 23, 2019, 32 pages.
European Search Report received for EP Application No. 17175165.4 dated Aug. 10, 2017, 9 pages.
European Search Report received for EP Application No. 17175166.2 dated Aug. 14, 2017, 9 pages.
Feddersen, Charles, "Real-Time Event Processing with Microsoft Azure Stream Analytics", Reference Architecture, Jan. 2015, 31 pages.
Non-Final Office Action received for U.S. Appl. No. 15/609,301 dated Dec. 13, 2018, 35 pages.
Non-Final Office Action received for U.S. Appl. No. 15/609,323 dated Dec. 31, 2018, 34 pages.
Communication pursuant to Article 94(3) received for EP Application No. 17175165.4 dated Jan. 18, 2019, 8 pages.
Communication pursuant to Article 94(3) received for EP Application No. 17175166.2 dated Dec. 20, 2018, 10 pages.
Non-Final Office Action received for U.S. Appl. No. 15/609,301 dated Sep. 3, 2019, 35 pages.
Notice of Allowance received for U.S. Appl. No. 15/609,323 dated Aug. 12, 2019, 37 pages.
Non-Final Office Action received for U.S. Appl. No. 15/936,870 dated Jul. 10, 2019, 51 pages.
Non-Final Office Action received for U.S. Appl. No. 15/936,940 dated Sep. 9, 2019, 65 pages.
First Office Action received for Chinese Patent Application Serial No. 201710432617.4 dated Jun. 20, 2019, 19 pages (Including English Translation).
First Office Action received for Chinese Patent Application Serial No. 201710433517.3 dated Jun. 21, 2019, 19 pages (Including English Translation).

* cited by examiner

INDUSTRIAL AUTOMATION INFORMATION CONTEXTUALIZATION METHOD AND SYSTEM

BACKGROUND

The subject matter disclosed herein relates generally to industrial automation systems, and, for example, to collection and visualization of industrial data.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for presenting industrial data is provided, comprising a model configuration component configured to define, based on model configuration input data, an asset model that defines one or more industrial assets in terms of hierarchical elements, wherein the asset model references data tags defined on an industrial device that respectively conform to one of a set of basic information data types, the set of basic information data types comprising at least a state data type, a rate data type, an odometer data type, and an event data type; a discovery component configured to discover the data tags on the industrial device and to retrieve industrial data and metadata associated with the data tags from the industrial device; and a presentation component configured to generate a graphical presentation of the industrial data that is formatted in accordance with the asset model and the metadata.

Also, one or more embodiments provide a method, comprising defining, on a system comprising a processor based on configuration input data, an asset model that defines one or more industrial assets in terms of hierarchical elements, wherein the asset model references data tags maintained on an industrial device that respectively conform to a basic information data type of a set of basic information data types, the set of basic information data types comprising at least a state data type, a rate data type, an odometer data type, and an event data type; discovering, by the system, the data tags on the industrial device; retrieving, by the system from the industrial device, industrial data and metadata associated with the data tags; and generating, by the system, a graphical display of the industrial data, wherein the generating comprises formatting the graphical display based on the asset model and the metadata.

Also, according to one or more embodiments, a non-transitory computer-readable medium is provided having stored thereon instructions that, in response to execution, cause a system to perform operations, the operations comprising defining, based on configuration input data, an asset model that defines one or more industrial assets in terms of hierarchical elements, wherein the asset model references data tags maintained on an industrial device that respectively conform to a basic information data type of a set of basic information data types, the set of basic information data types comprising at least a state data type, a rate data type, an odometer data type, and an event data type; discovering the data tags on the industrial device; retrieving, from the industrial device, industrial data and metadata associated with the data tags; and generating a graphical display of the industrial data, wherein the generating comprises formatting the graphical display based on the asset model and the metadata.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
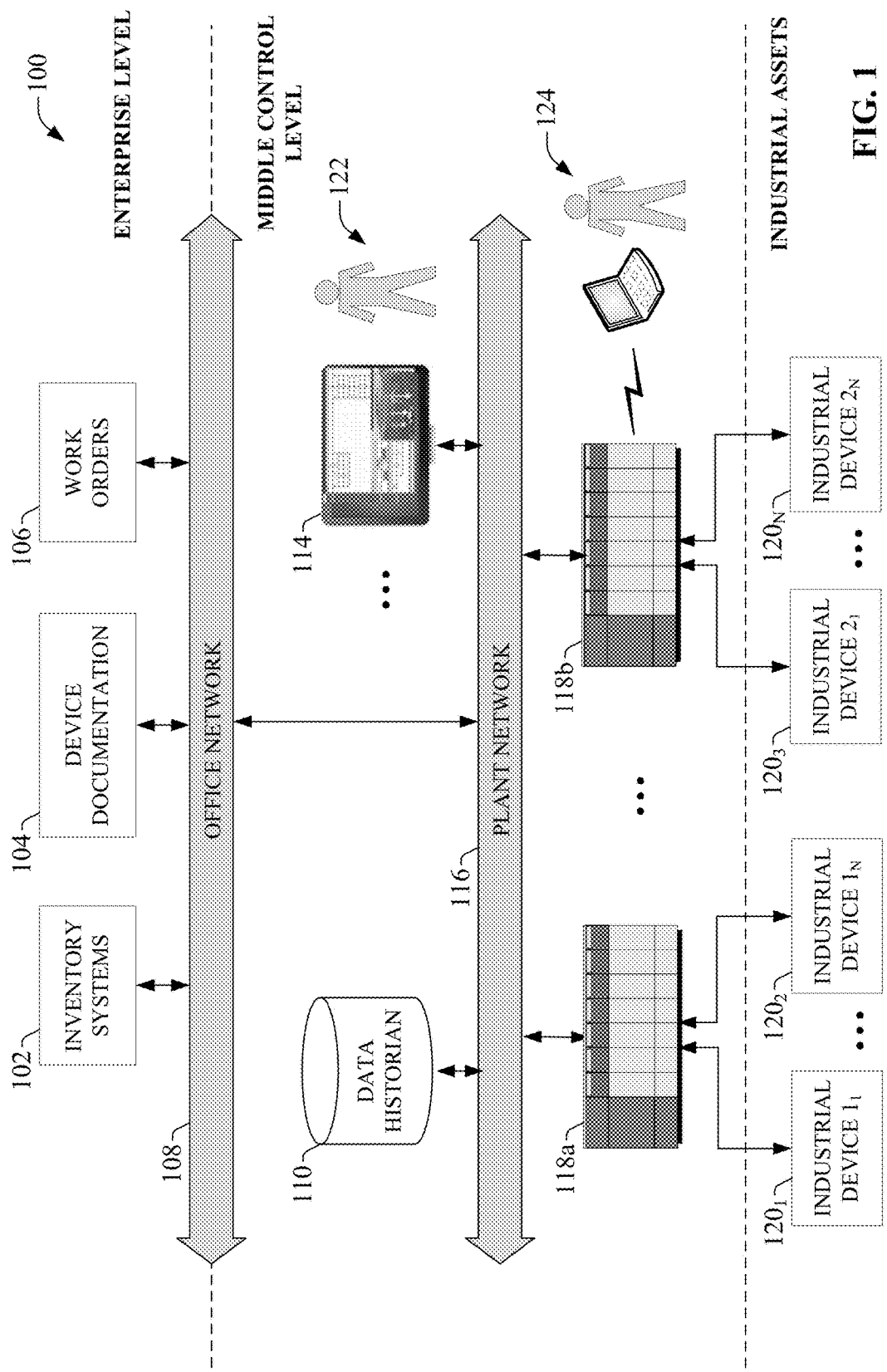
FIG. 1 is a block diagram of an example industrial control environment.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers and their associated I/O devices are central to the operation of modern automation systems. These controllers interact with field devices on the plant floor to control automated processes relating to such objectives as product manufacture, material handling, batch processing, supervisory control, and other such applications. Industrial controllers store and execute user-defined control programs to effect decision-making in connection with the controlled process. Such programs can include, but are not limited to, ladder logic, sequential function charts, function block diagrams, structured text, or other such platforms.

FIG. 1 is a block diagram of an example industrial control environment 100. In this example, a number of industrial controllers 118 are deployed throughout an industrial plant environment to monitor and control respective industrial systems or processes relating to product manufacture, machining, motion control, batch processing, material handling, or other such industrial functions. Industrial controllers 118 typically execute respective control programs to facilitate monitoring and control of industrial devices 120 making up the controlled industrial assets or systems (e.g., industrial machines). One or more industrial controllers 118 may also comprise a soft controller executed on a personal computer or other hardware platform, or on a cloud platform. Some hybrid devices may also combine controller functionality with other functions (e.g., visualization). The control programs executed by industrial controllers 118 can comprise any conceivable type of code used to process input signals read from the industrial devices 120 and to control output signals generated by the industrial controllers, including but not limited to ladder logic, sequential function charts, function block diagrams, or structured text.

Industrial devices 120 may include both input devices that provide data relating to the controlled industrial systems to the industrial controllers 118, and output devices that respond to control signals generated by the industrial controllers 118 to control aspects of the industrial systems. Example input devices can include telemetry devices (e.g., temperature sensors, flow meters, level sensors, pressure sensors, etc.), manual operator control devices (e.g., push buttons, selector switches, etc.), safety monitoring devices (e.g., safety mats, safety pull cords, light curtains, etc.), and other such devices. Output devices may include motor drives, pneumatic actuators, signaling devices, robot control inputs, valves, and the like.

Industrial controllers 118 may communicatively interface with industrial devices 120 over hardwired or networked connections. For example, industrial controllers 118 can be equipped with native hardwired inputs and outputs that communicate with the industrial devices 120 to effect control of the devices. The native controller I/O can include digital I/O that transmits and receives discrete voltage signals to and from the field devices, or analog I/O that transmits and receives analog voltage or current signals to and from the devices. The controller I/O can communicate with a controller's processor over a backplane such that the digital and analog signals can be read into and controlled by the control programs. Industrial controllers 118 can also communicate with industrial devices 120 over a network using, for example, a communication module or an integrated networking port. Exemplary networks can include the Internet, intranets, Ethernet, DeviceNet, ControlNet, Data Highway and Data Highway Plus (DH/DH+), Remote I/O, Fieldbus, Modbus, Profibus, wireless networks, serial protocols, and the like. The industrial controllers 118 can also store persisted data values that can be referenced by the control program and used for control decisions, including but not limited to measured or calculated values representing operational states of a controlled machine or process (e.g., tank levels, positions, alarms, etc.) or captured time series data that is collected during operation of the automation system (e.g., status information for multiple points in time, diagnostic occurrences, etc.). Similarly, some intelligent devices—including but not limited to motor drives, instruments, or condition monitoring modules—may store data values that are used for control and/or to visualize states of operation. Such devices may also capture time-series data or events on a log for later retrieval and viewing.

Industrial automation systems often include one or more human-machine interfaces (HMIs) 114 that allow plant personnel to view telemetry and status data associated with the automation systems, and to control some aspects of system operation. HMIs 114 may communicate with one or more of the industrial controllers 118 over a plant network 116, and exchange data with the industrial controllers to facilitate visualization of information relating to the controlled industrial processes on one or more pre-developed operator interface screens. HMIs 114 can also be configured to allow operators to submit data to specified data tags or memory addresses of the industrial controllers 118, thereby providing a means for operators to issue commands to the controlled systems (e.g., cycle start commands, device actuation commands, etc.), to modify setpoint values, etc. HMIs 114 can generate one or more display screens through which the operator interacts with the industrial controllers 118, and thereby with the controlled processes and/or systems. Example display screens can visualize present states of industrial systems or their associated devices using graphical representations of the processes that display metered or calculated values, employ color or position animations based on state, render alarm notifications, or employ other such techniques for presenting relevant data to the operator. Data presented in this manner is read from industrial controllers 118 by HMIs 114 and presented on one or more of the display screens according to display formats chosen by the HMI developer. HMIs may comprise fixed location or mobile devices with either user-installed or pre-installed operating systems, and either user-installed or pre-installed graphical application software.

Some industrial environments may also include other systems or devices relating to specific aspects of the controlled industrial systems. These may include, for example, a data historian 110 that aggregates and stores production information collected from the industrial controllers 118 or other data sources, or a device documentation store 104 containing electronic documentation for the various industrial devices making up the controlled industrial systems. Other systems may include an inventory tracking system 102, a work order management system 106, repositories for machine or process drawings and documentation, vendor product documentation storage, vendor knowledgebases, internal knowledgebases, work scheduling applications, or other such systems, some or all of which may reside on an office network 108 of the industrial environment.

Figure 2:
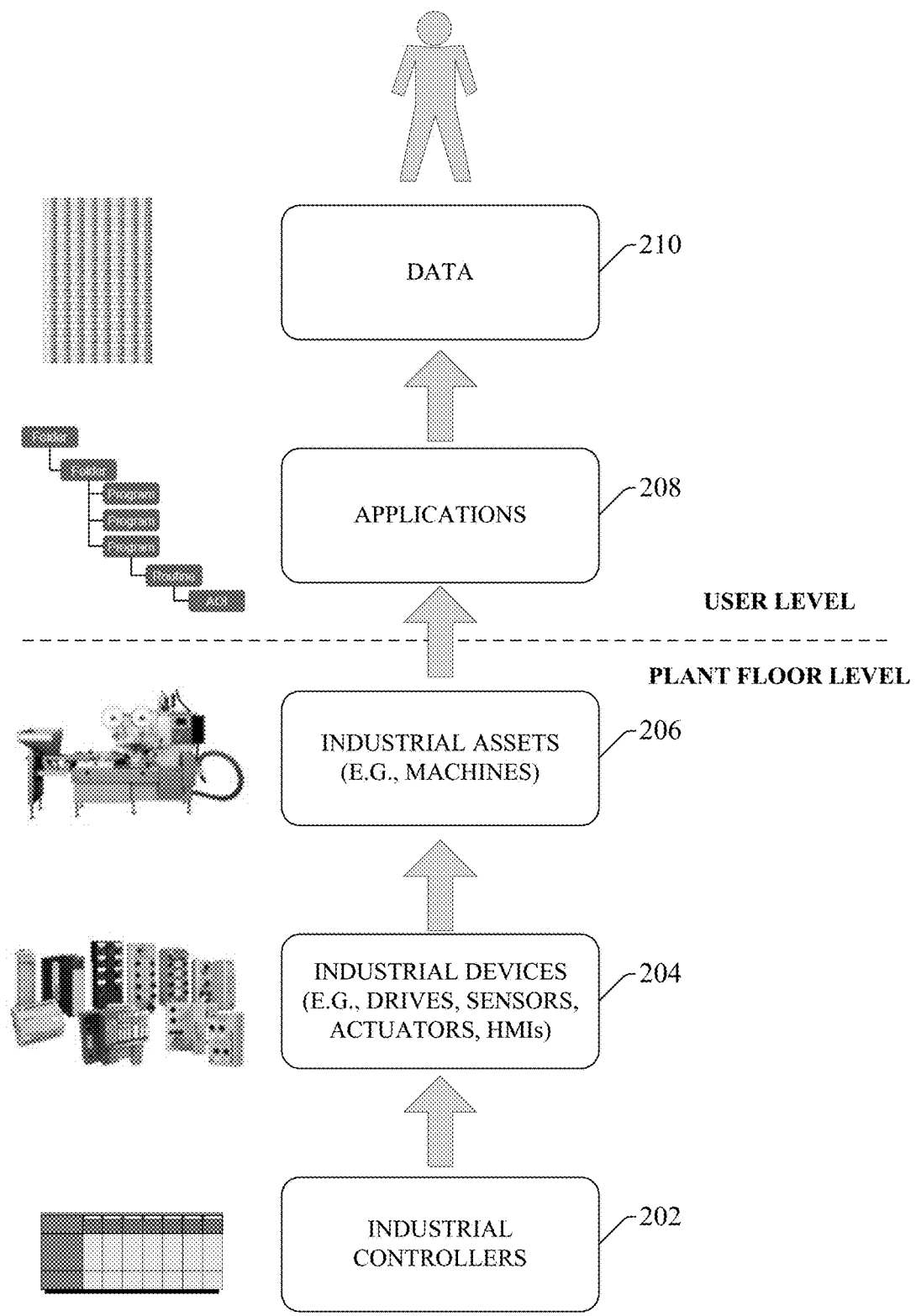
FIG. 2 is a conceptual diagram illustrating the flow of industrial data across various information levels in a typical industrial environment.

Industrial assets and their associated industrial assets can generate large amounts of information during operation. FIG. 2 is a conceptual diagram illustrating the flow of industrial data across various information levels in a typical industrial environment. On the plant floor level, industrial assets 206—e.g., industrial machines, production lines, industrial robots, etc.—carry out respective tasks in connection with manufacture, packaging, or handling of a product; control of an industrial process; or other such industrial functions. These industrial assets 206 are directly monitored and controlled by industrial devices 204. For example, various statuses and metrics of the industrial assets 206 (e.g., actuator positions, motor speeds, temperatures, flows, pressures, human presence, etc.) can be monitored using proximity switches, telemetry devices, photo-sensors, or other such monitoring devices. Industrial devices that facilitate control of the industrial assets 206 can include, for example, motor drives, pneumatic actuators, remote I/O devices, or other such equipment. Industrial devices 204 can also include HMIs (e.g., HMIs 114).

Industrial controllers 202 perform supervisory monitoring and control of the industrial assets 206 via industrial devices 204. In this regard, industrial devices 204 serve as inputs and outputs for industrial controllers 202, which control their output industrial devices in accordance with user-defined control routines (e.g., ladder logic programs, sequential function chart programs, etc.) and the current values and statuses of the input industrial devices. Data generated by industrial devise 204 reflect the current statuses of the industrial assets 206. This data is read by industrial controllers 202, which can generate additional data (e.g., calculated supplemental data, aggregated values, etc.) based on these industrial device statues and values.

At the user level, customized applications—e.g., reporting applications, visualization applications, enterprise resource planning applications, manufacturing execution systems, etc.—can collect selected subsets of information available in industrial controllers 206 and present this information as formatted data 210 to a user in accordance with data presentation formats defined in the applications 208.

Collecting and delivering some or all of this information to a user in meaningful presentation formats can offer valuable insights into past, current, and future operation of the industrial assets 202. However, the highly distributed nature of data available across many industrial devices associated with various industrial machines or systems that make up an industrial enterprise presents a challenge with regard to collection and formatting of the data for a common presentation that can be delivered to a user's client device. Moreover, much of the information available on a given set of industrial devices comprises uncontextualized, unstructured data (e.g., integer, real, or discrete values stored on the data table of an industrial controller) whose meaning must be defined by the applications 208 used to present the data. This places a burden on the developers of such applications 208, who must designate the meaning of each item of unstructured data received and rendered by these applications so that the data will have meaning to the viewer (e.g., a product count, a production rate, a system temperature or pressure, a historical trend, etc.).

To address these and other issues, one or more embodiments of the present disclosure provide an industrial data presentation system that supports the use of structured data types in connection with generating and delivering meaningful presentations of industrial data. In one or more embodiments, industrial devices and/or controllers are configured to support structured data types—referred to herein as basic information data types (BIDTs)—comprising a finite set of structured information data types. In an example implementation, the basic information data types can comprise four structured information data types representing (1) a rate, (2) states, (3), an odometer, and (2) events. Within an industrial device or controller configuration, a user can define associations between respective physical assets (e.g., a machine, a production line, etc.) and one or more of the basic information data types. This can include, for example, defining one or more data tags representing a metric or status of the physical asset and associating each tag with one of the basic information data types. Each basic information data type has associated metadata that can be configured by a user to customize the data tag for a given industrial application (e.g., maximum and minimum values for rate data types, roll-over values for odometer data types, event or state names for event and state data types, any parent-child relationships between data tags, etc.).

Once configured in an industrial device or controller, the BIDTs are discoverable by external data collection and/or visualization systems, including local systems sharing a network with the industrial device or remote cloud-based systems. For example, a gateway device can be configured with one or more asset models that reference BIDT data tags on the industrial devices. The asset models assign groups of BIDT data tags to respective hierarchical elements of the asset models (e.g., a production facility, a production area or line, and industrial asset, a unit of equipment, an industrial device, etc.). The gateway device can retrieve industrial data from the BIDT data tags, as well as the associated user-defined metadata for each tag. Then either the gateway device or a separate application server system can generate a graphical presentation of the industrial data based on a selected one of the asset models and the BIDT metadata.

Figure 3:
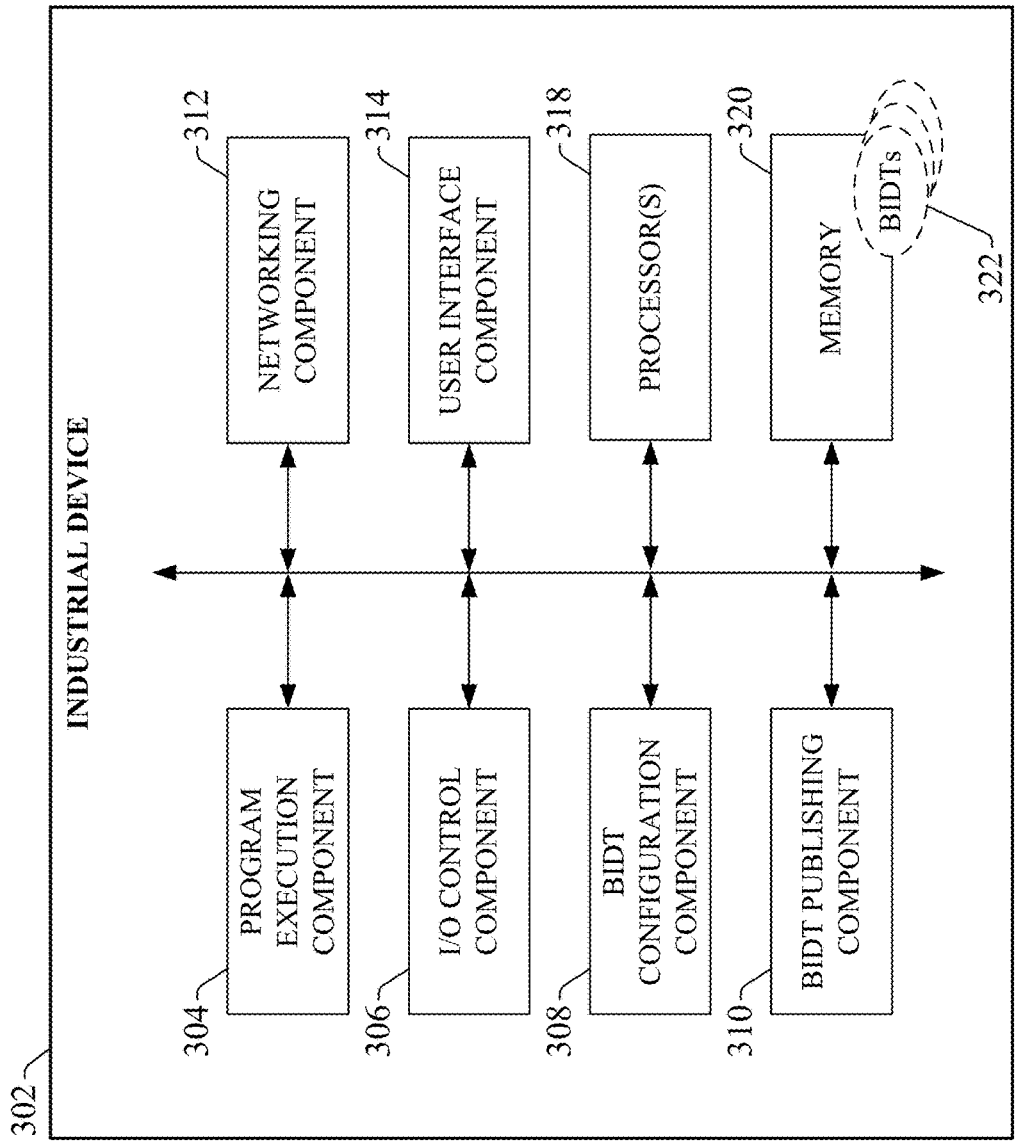
FIG. 3 is a block diagram of an example industrial device that supports basic information data types (BIDTs).

FIG. 3 is a block diagram of an example industrial device 302 that supports basic information data types according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Industrial device 302 can comprise substantially any type of data-generating industrial device, including but not limited to an industrial controller, a motor drive, an HMI terminal, a vision system, an industrial optical scanner, or other such device or system. Industrial device 302 can include a program execution component 304, an I/O control component 306, a BIDT configuration component 308, a BIDT publishing component 310, a networking component 312, a user interface component 314, one or more processors 318, and memory 320. In various embodiments, one or more of the program execution component 304, I/O control component 306, BIDT configuration component 308, BIDT publishing component 310, networking component 312, user interface component 314, the one or more processors 318, and memory 320 can be electrically and/or communicatively coupled to one another to perform one or more of the functions of the industrial device 302. In some embodiments, components 304, 306, 308, 310, 312, and 314 can comprise software instructions stored on memory 320 and executed by processor(s) 318. Industrial device 302 may also interact with other hardware and/or software components not depicted in FIG. 3. For example, processor(s) 318 may interact with one or more external user interface devices, such as a keyboard, a mouse, a display monitor, a touchscreen, or other such interface devices.

Program execution component 304 can be configured to compile and execute a user-defined control program. In various embodiments, the control program can be written in any suitable programming format (e.g., ladder logic, sequential function charts, structured text etc.) and downloaded to the industrial device 302. Typically, the control program uses data values read by the industrial device's analog and digital inputs as input variables, and sets values of the industrial device's analog and digital outputs in accordance with the control program instructions based in part on the input values. I/O control component 306 can be configured to control the electrical output signals of the industrial device's digital and analog electrical outputs in accordance with the control program outputs, and to convert electrical signals on the industrial device's analog and digital inputs to data values that can be processed by the program execution component 304.

BIDT configuration component 308 can be configured to set metadata values associated with BIDT data tags defined for the industrial device 302 based on metadata configuration input data. As will be described in more detail below, in addition to standard general data types (e.g., real, analog, digital, etc.), industrial device 302 is configured to support industrial-specific data types referred to herein as basic information data types (BIDTs). Data tags associated with these basic information data types have associated metadata that can be configured by the user via BIDT configuration component 308 in order to customize the data tags for a given industrial application. For convenience, data tags that are associated with a basic information data type are referred to herein as "BIDTs." BIDTs 322 defined by the user are stored in memory 320 (e.g., in the industrial device's tag database together other defined data tags of other data types).

BIDT publishing component 310 is configured to expose defined BIDTs 322 to external systems, allowing the BIDTs 322 to be discovered by such systems over a local and/or remote network. Networking component 312 can be configured to exchange data with one or more external devices over a wired or wireless network using any suitable network protocol. User interface component 314 can be configured to receive user input and to render output to the user in any suitable format (e.g., visual, audio, tactile, etc.). In some embodiments, user interface component 314 can be configured to communicatively interface with a development application that executes on a client device (e.g., a laptop computer, tablet computer, smart phone, etc.) that is communicatively connected to the industrial device 302 (e.g., via a hardwired or wireless connection). The user interface component 314 can then receive user input data and render output data via the development application. In other embodiments, user interface component 314 can be configured to generate and serve suitable graphical interface screens to a client device, and exchange data via these graphical interface screens. Input data that can be received via user interface component 314 can include, but is not limited to, user-defined control programs or routines, data tag definitions, BIDT metadata configuration data, or other such data.

The one or more processors 318 can perform one or more of the functions described herein with reference to the systems and/or methods disclosed. Memory 320 can be a computer-readable storage medium storing computer-executable instructions and/or information for performing the functions described herein with reference to the systems and/or methods disclosed.

Figure 4:
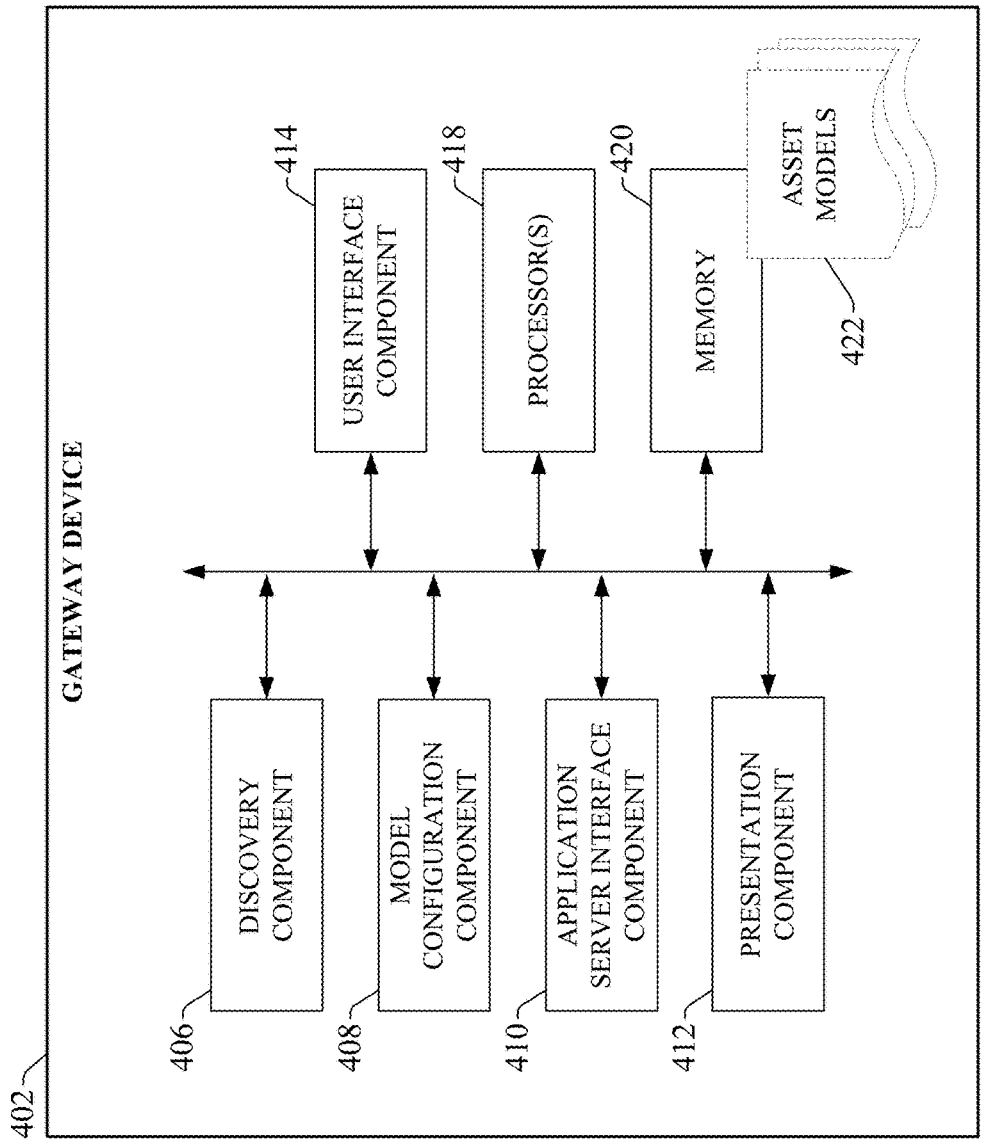
FIG. 4 is a block diagram of a gateway device capable of discovering BIDTs on one or more industrial devices and formatting a presentation of associated data in accordance with a user-defined asset model.

FIG. 4 is a block diagram of a gateway device 402 capable of discovering BIDTs on one or more industrial devices and formatting a presentation of associated data in accordance with a user-defined asset model. Gateway device 402 can include a discovery component 406, a model configuration component 408, an application server interface component 410, a presentation component 412, a user interface component 314, one or more processors 418, and memory 420. In various embodiments, one or more of the discovery component 406, model configuration component 408, application server interface component 410, presentation component 412, user interface component 314, the one or more processors 418, and memory 420 can be electrically and/or communicatively coupled to one another to perform one or more of the functions of the gateway device 402. In some embodiments, components 404, 406, 408, 410, 412, and 414 can comprise software instructions stored on memory 420 and executed by processor(s) 418. Gateway device 402 may also interact with other hardware and/or software components not depicted in FIG. 4. For example, processor(s) 418 may interact with one or more external user interface devices, such as a keyboard, a mouse, a display monitor, a touchscreen, or other such interface devices.

Discovery component 406 can be configured to discover BIDTs (e.g., BIDTs 322) defined on industrial devices (e.g., industrial device 302) that are communicatively connected to the gateway device 402. Discovery component 406 can also be configured to retrieve data and metadata associated with the BIDTs for use in generating industrial data presentations. Model configuration component 408 can be configured to create and store one or more asset models 422 in accordance with user-defined asset model definitions. These asset models can represent an industrial asset or collection of industrial assets in terms of hierarchical elements of an industrial facility or collection of facilities, where these hierarchical element can include, but are not limited to, a plant, a production area or line, an industrial machine or other industrial asset, a unit of equipment that makes up an industrial asset, an industrial device (e.g., a controller, a motor drive, a vision system device, a safety device, etc.) associated with an industrial asset, or other such elements. Asset models 422 can also assign groups of BIDTs to respective elements of the hierarchical model. Asset models 422 can be customized to suit the information requirements of various types of information consumers (e.g., line operators, engineers, plant managers, etc.)

Application server interface component 410 can be configured to expose asset models 422 and industrial data collected from industrial devices (e.g., industrial device 302) to an application server (e.g., application server system 502 discussed below), which can aggregate multiple asset models 422 into a larger aggregate plant or enterprise model and generate graphical presentations of the industrial data based on the plant model. Presentation component 412 can be configured to generate a data presentation—e.g., in the form of a graphical display layout, a collection of widgets, etc.—that renders selected subsets of industrial data received from the discovery component 406 in accordance with one or more of the asset models 422. In some embodiments, presentation component 412 can be configured to render data associated with a BIDT using a suitable BIDT-specific widget (or other graphical display element) selected from a set of predefined widgets.

User interface component 414 can be configured to receive user input and to render output to the user in any suitable format (e.g., visual, audio, tactile, etc.). In some embodiments, user interface component 414 can be configured to communicatively interface with a client application that executes on a client device (e.g., a laptop computer, tablet computer, smart phone, etc.) that is communicatively connected to the gateway device 402 (e.g., via a hardwired or wireless connection). The user interface component 414 can then receive user input data and render output data via the client application. In other embodiments, user interface component 414 can be configured to generate and serve suitable graphical interface screens to a client device, and exchange data via these graphical interface screens. Input data that can be received via user interface component 414 can include, but is not limited to, asset model definitions that are saved as asset models 422, or other such data.

The one or more processors 418 can perform one or more of the functions described herein with reference to the systems and/or methods disclosed. Memory 420 can be a computer-readable storage medium storing computer-executable instructions and/or information for performing the functions described herein with reference to the systems and/or methods disclosed.

Figure 5:
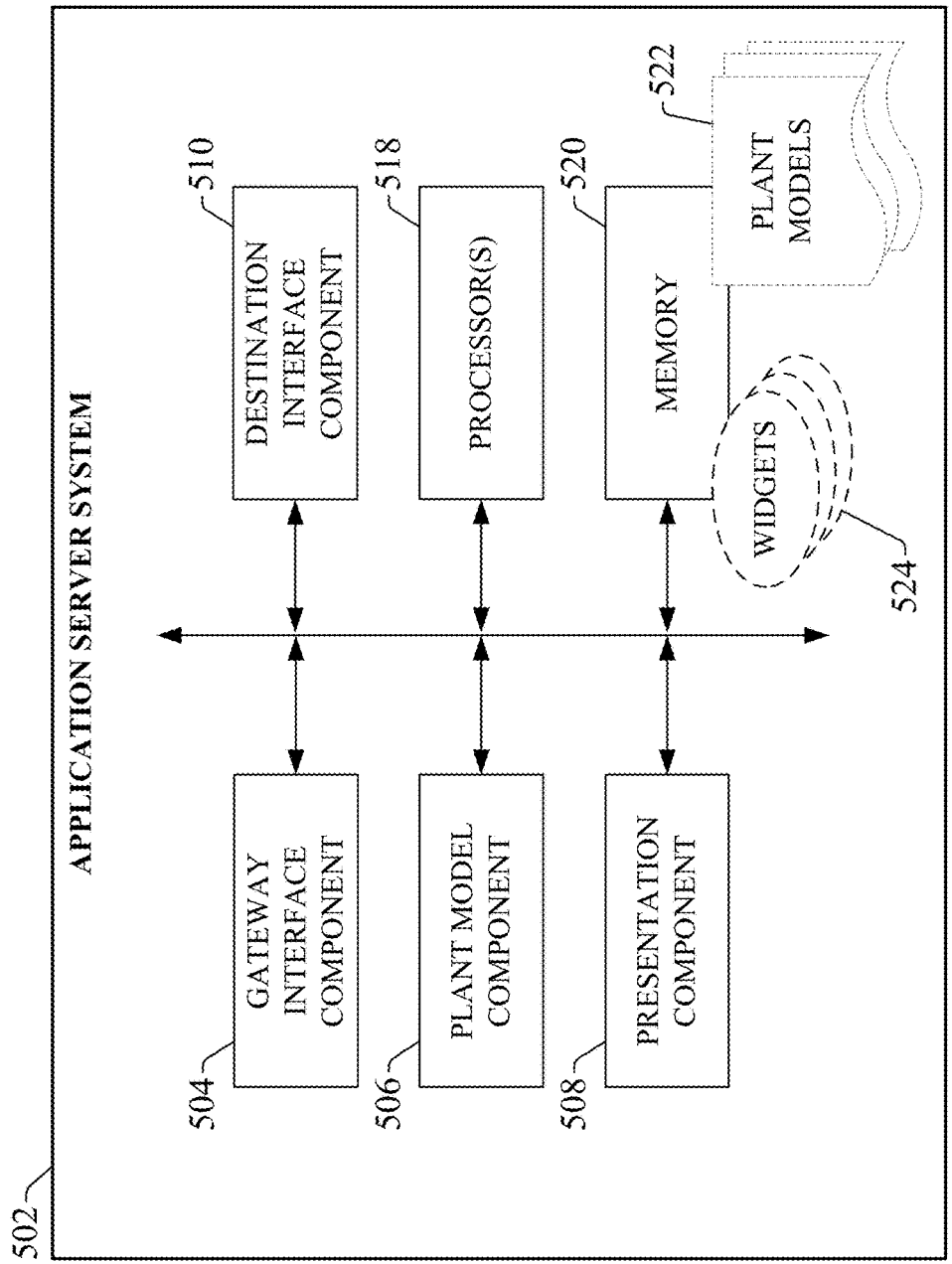
FIG. 5 is a block diagram of an application server system capable of aggregating asset models from gateway devices into one or more plant models and formatting a presentation of associated data received from the gateway devices in accordance with the aggregated plant models.

FIG. 5 is a block diagram of an application server system 502 capable of aggregating asset models 422 from gateway devices (e.g., gateway device 402) into one or more plant models 522 and formatting a presentation of associated data received from the gateway devices 402 in accordance with the aggregated plant models 522. Application server system 502 can include a gateway interface component 504, a plant model component 506, a presentation component 508, a destination interface component 510, one or more processors 518, and memory 520. In various embodiments, one or more of the gateway interface component 504, plant model component 506, presentation component 508, destination interface component 510, the one or more processors 518, and memory 520 can be electrically and/or communicatively coupled to one another to perform one or more of the functions of the application server system 502. In some embodiments, components 504, 506, 508, and 510 can comprise software instructions stored on memory 520 and executed by processor(s) 518. Application server system 502 may also interact with other hardware and/or software components not depicted in FIG. 5. For example, processor(s) 518 may interact with one or more external user interface devices, such as a keyboard, a mouse, a display monitor, a touchscreen, or other such interface devices.

Gateway interface component 504 can be configured to exchange data with one or more gateway devices (e.g., gateway device 402) over a wired or wireless network. In some embodiments, application server system 502 can be an on-premise device that resides on the plant floor, and the gateway interface component 504 can exchange data with the gateway devices 402 over a local plant and/or office network. In other embodiments, application server system 502 can reside on a cloud platform. In such embodiments, the gateway interface component 504 can exchange data with the gateway devices 402 over a combination of a public network (e.g., an Internet layer) and a private network (e.g., a plant or office network at the industrial facility).

The plant model component 506 can be configured to discover asset models 422 maintained on one or more gateway devices 402, and to aggregate these discovered asset models 422 into an overall plant model 522 for an industrial facility or enterprise. The plant model 522 can define hierarchical relationships between industrial assets of a given plant facility, or between assets distributed across geographically diverse plant facilities. The plant model 522 also defines relationships between BIDT data items associated with the respective industrial assets by assigning groups of BIDTs defined in industrial devices associated with the industrial assets to respective hierarchical elements of the plant model 522 (e.g., production lines, industrial asset identifiers, units of equipment, industrial devices, etc.). By defining relationships between assets that make up an industrial facility or enterprise, the plant models 522 similarly define relationships between data items associated with those assets. The hierarchical relationships defined by the plant models 522 can be leveraged by the application server system 502 to present information about the assets to a user in a structured fashion.

Presentation component 508 can be configured to generate a data presentation—e.g., in the form of a graphical display layout, a collection of widgets 524, etc.—that renders selected subsets of data received from the gateway devices 402 in accordance with one or more of the plant models 522. In some embodiments, presentation component 508 can be configured to render data associated with a basic information data type tag using a suitable BIDT-specific widget (or other graphical display element) selected from a set of predefined widgets 524. Destination interface component 510 can be configured to exchange data with one or more destination client devices over a wired or wireless network (e.g., a private plant or office network, a cloud platform, or a public network such as the Internet). This can include delivering the graphical data presentations to a client device in accordance with one or more of the plant models 522.

The one or more processors 518 can perform one or more of the functions described herein with reference to the systems and/or methods disclosed. Memory 520 can be a computer-readable storage medium storing computer-executable instructions and/or information for performing the functions described herein with reference to the systems and/or methods disclosed.

Figure 6:
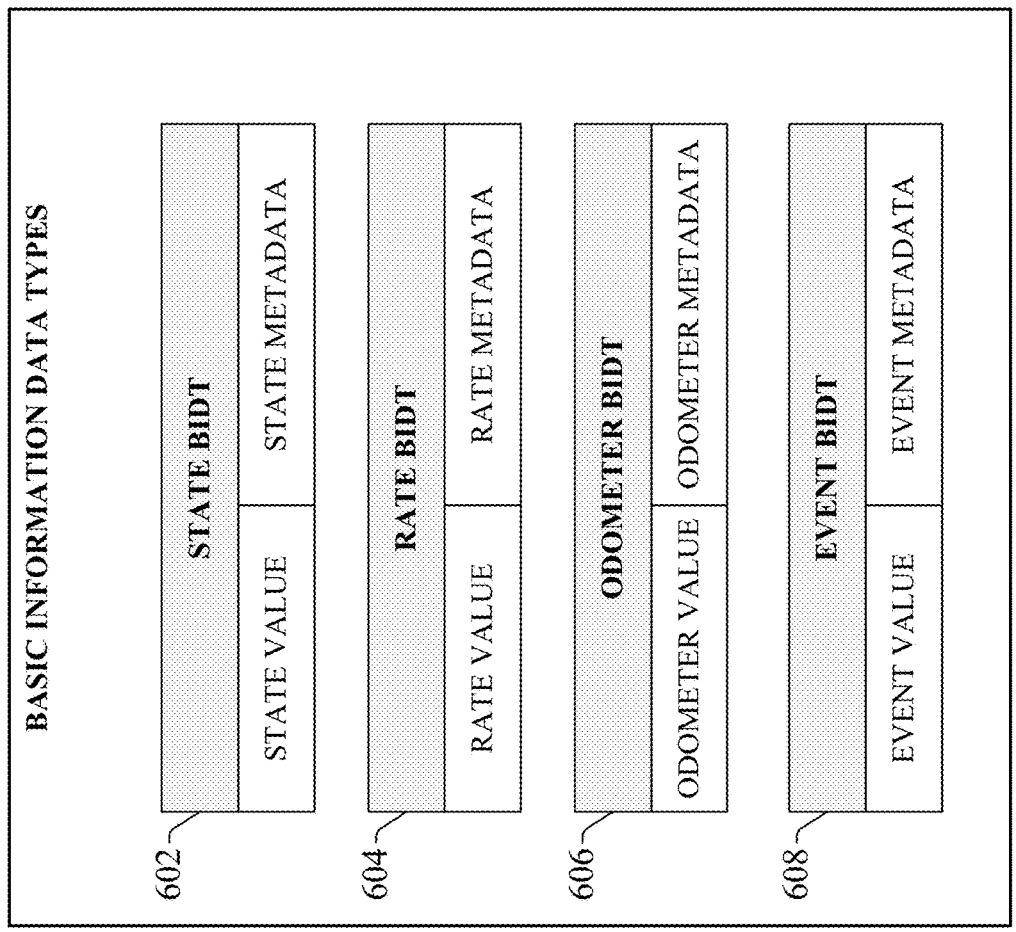
FIG. 6 is an illustration of four example BIDTs that can be supported by one or more embodiments of an industrial device.

FIG. 6 is an illustration of four example basic information data types that can be supported by one or more embodiments of industrial device 302. These data types can supplement other standard data types that are typically supported by industrial controllers or other industrial devices (e.g., integer, real, Boolean, string, floating point etc.). In general, data tags are data structures defined within an industrial device that reference a memory location within the device (e.g., an input value, an output value, or an internal data register) and correspond to respective data items. A data tag can be configured to be of a specified data type, such as Boolean, floating point, integer, double integer, string, etc. During development, controller tags can be created and maintained in a tag database of the industrial device. The BIDTs described herein are additional data types that are catered to industrial automation applications, and that supplement conventional data types.

In the illustrated example, the basic information data types comprise a finite set of four structured information data types—a State BIDT 602, a Rate BIDT 604, an Odometer BIDT 606, and an Event BIDT 608. Although the examples described herein assume that the supported BIDTs comprise these four data types, it is to be appreciated that some embodiments may include other BIDT data types without departing from the scope of this disclosure.

Each BIDT includes a field for storing the current value of the BIDT (e.g., a state value, a rate value, an Odometer value, and an Event value) as well as one or more metadata fields configured to store user-defined configuration data for that BIDT. The metadata values for each BIDT can customize management and presentation of the associated BIDT data value in accordance with the particular industrial asset or industrial application with which the BIDT is associated.

The value contained in a State BIDTs 602 can represent a current state of an industrial asset or device (e.g., a machine, a production line, a motor drive, etc.). The state data contained in a State BIDT 602 can represent one of a set of predefined states representative of a current state or status of the associated industrial asset or device. For example, the State BIDT may convey an S88 state, a Packaging Machine Language state, a current state of a state machine defined for the asset, a state of a valve (e.g., OPEN or CLOSED), a state of a motor (e.g., RUNNING, IDLE, FAULTED, etc.), or other types of states.

User-configurable metadata associated with the State BIDT 602 (which can be configured by BIDT configuration component 308 in accordance with user input received via user interface component 314) may define a state machine representing available states of the associated asset, where each defined state is configured to be invoked in response to a detected condition. For example, each defined state may be linked via the metadata to one or more other related data tags defined in the industrial device 302 (e.g., a data tag representing a state of a sensor or switch indicative of the defined state), such that the current state indicated by the State BIDT 602 is a function of the current values of the related data tags.

The value contained in a Rate BIDT 604 can represent an integer or real value of a measured rate of a metric associated with the industrial asset or device. The rate value can be an instantaneous rate or a value representing a rate of change of the metric over time. For example, the rate value contained in the Rate BIDT 604 can represent a temperature, a pressure, a velocity (e.g., a velocity of a conveyor or other motor-driven machine component), an overall equipment effectiveness (OEE), or other such metric.

User-configurable metadata associated with the Rate BIDT 604 can define maximum and minimum values for the corresponding rate value, such that the value contained in the Rate BIDT 604 will not deviate outside the window defined by the maximum and minimum value metadata. The metadata can also identify one or more data sources (e.g., one or more other data tags or input addresses) that determine the event. For example, the metadata for the Rate BIDT 604 can define whether the corresponding rate value is an aggregation of multiple other values contained in other defined data tags. In this regard, the user can define the rate value to be an average or a sum of two or more identified data tags, or an integral of a data tag over time. Another metadata field can be used to designate an engineering unit to be associated with the rate.

The value contained in the Odometer BIDT 606 can represent a cumulative quantity associated with an industrial asset. For example, the Odometer BIDT 606 can be configured to represent cumulative quantity with a rollover value, such as a part count associated with the industrial asset. In such cases, the metadata associated with the Odometer BIDT 606 can include a definition of the rollover value. The Odometer BIDT 606 may also be configured to represent a quantity over a defined time interval, such as an energy consumption associated with the asset. In the case of quantities over a defined time interval, the metadata associated with the Odometer BIDT 606 can include a definition of the time interval, which may be defined in terms of daily start and end times, in terms of a start time and a defined duration of the time interval, or as another time definition format. The metadata associated with the Odometer BIDT 606 can also define one or more data sources that drive the odometer value. For example, the metadata may define a data tag associated with a Cycle Complete event, such that the odometer value will increment when the Cycle Complete data tag goes high. The odometer value may also be defined to be an aggregation of multiple values. In such cases, the metadata may identify two or more data tags whose values are to be aggregated or summed to yield the odometer value. The metadata can also define a unit of measure associated with the odometer value (e.g., bottles filled, operating cycles, megawatt-hours, etc.).

The value contained in the Event BIDT 608 can represent an instantaneous or persistent event associated with an industrial asset. For example, an Event BIDT 608 may represent an instantaneous event such as a push-button event (e.g., "Service Button Pushed"), a sensor event (e.g., "Part Present," "Person Detected," etc.), a safety device event (e.g., "Light Curtain Broken"), or another such instantaneous event. Persistent events that can be represented by Event BIDT 608 can include, but are not limited to, events associated with an alarm status (e.g., "Alarm Unacknowledged," "Alarm Acknowledged," etc.). Other examples of persistent events that can be represented by an Event BIDT 608 can include persistent events with an identifier and a state. For example, events associated with a batch process can include a batch number (an identifier) and an associated event (e.g., "Starting," "Executing," "Complete," etc.). User-configurable metadata associated with the Event BIDT 610 can include identifiers of other data tags whose states, in aggregation, determine the event to be represented by the Event BIDT 610. Alternatively, if the event represented by Event BIDT 608 is a function of only a single input (e.g., a push-button input), the metadata can identify the appropriate input address of the industrial device.

In addition to the metadata described above for each basic information data type, the BIDTs may also include configurable metadata fields that define communication or discovery parameters for the respective BIDTs. For example, each BIDT may include an Update Rate metadata parameter that allows the user to set the rate or frequency at which the BIDT sends its data to a gateway device in order to update a corresponding data presentation. Such metadata fields may allow the user to set the update period for the BIDT (e.g., a 60 second period, which causes the BIDT to send updated values every 60 seconds), or to specify that the BIDT is to send its updated value substantially continuously (e.g., every 5 milliseconds to 10 seconds).

It is to be appreciated that the BIDTs described above in connection with FIG. 6 are intended to be exemplary, and that other types of BIDTs are also within the scope of one or more embodiments of this disclosure.

Figure 7:
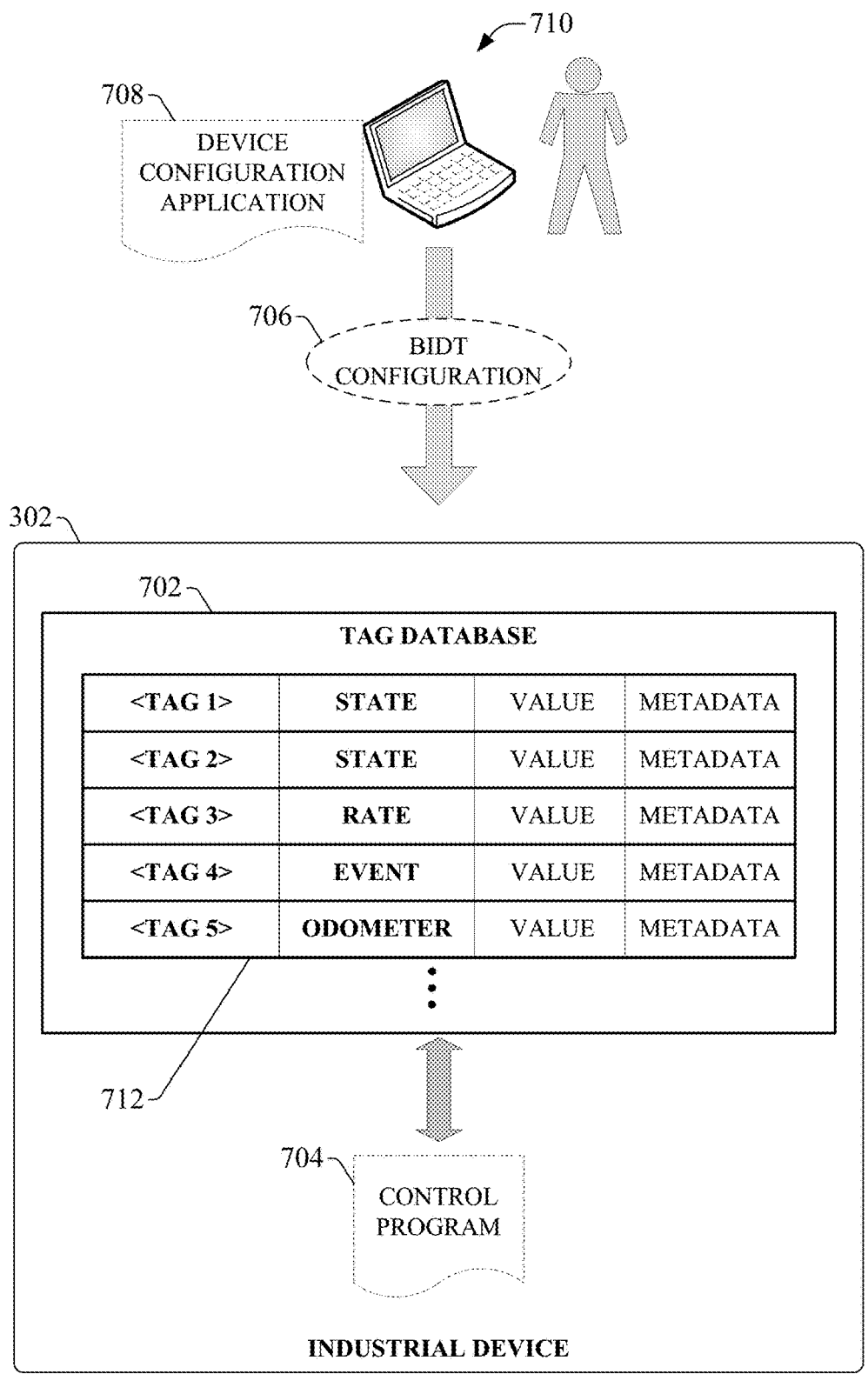
FIG. 7 is a diagram illustrating development of BIDTs in a tag database of an industrial device.

In an example scenario, a user can configure BIDTs in an industrial controller or other industrial device during control program development, along with other data tags to be used by the control program. FIG. 7 is a diagram illustrating configuration of BIDTs in a tag database 702 of an industrial device 302 that supports BIDTs. Industrial device 302 may be, for example, an industrial controller (e.g., a programmable logic controller or other type of programmable automation controller) configured to execute an industrial control program 704 to facilitate monitoring and control of an industrial machine or process. Industrial device 302 includes a tag database 702 that stores data tag definitions. The data tag definitions are configured by a user in tandem with development of control program 704 (e.g., a ladder logic program, a sequential function chart program, etc.), and define data tags 712 of various data types that are used to store and identify analog and digital data values generated and consumed by the control program 704. Example standard data types that can be represented by data tags 712 can include, for example, integer data types, real data types, Boolean data types, etc. In addition to these standard data types, one or more of the data tags 712 can includes BIDTs (e.g., BIDTs 602, 604, 606, and 608) associated with the basic information data types described herein.

In this example scenario, a user can configure both the control program 704 and the data tag definitions using a device configuration application 708 that executes on a client device 710 (e.g., a laptop computer, a desktop computer, a tablet computer, etc.) that is communicatively interfaced to the industrial device 302. In various embodiments, client device 710 can interface with the industrial device 302 over a hard-wired connection (e.g. a universal serial bus connection, an Ethernet connection, a serial connection, etc.) or over a wireless connection (e.g., near-field, WiFi, etc.) supported by user interface component 314. Device configuration application 708 can execute a program development environment that can be used to develop control program 704 and its associated data tags 712, including any BIDTs to be associated with one or more industrial assets to be controlled using control program 704.

During development, BIDT configuration component 308 of the industrial device 302 can create BIDTs corresponding to any of the BIDT types described above (state, rate, odometer, and event, or other supported BIDT types) in accordance with BIDT configuration input 706 downloaded to industrial device 302 by client device 710. Using device configuration application 708, the user can also configure the metadata associated with each BIDT in order to customize the BIDTs for a given industrial application. For example, for a State BIDT 602 associated with a bottle filling machine to be controlled by industrial device 302, the user may specify the various states to be represented by the tag (e.g., Running, Home, Abnormal, Idle, etc.). In some embodiments, the BIDT configuration component 308 can support a number of pre-defined states that can be selected by the user and associated with a given State BIDT. In addition or alternatively, the user can define the names of one or more of the states to be associated with the State BIDT.

For a Rate BIDT 604 representing a velocity of a conveyor that feeds bottles to the filling machine, the user can specify maximum and minimum values for the velocity value. Accordingly, the Rate BIDT 604 will not generate a velocity value that is outside the range defined by the defined maximum and minimum values, and may generate an error or alarm output if the measured velocity value exceeds the defined maximum or falls below the defined minimum. Another Rate BIDT 604 representing an average temperature may be configured to average multiple analog temperature input values specified by the user in the metadata. For an Odometer BIDT 606 representing a product count (e.g., the number of filled bottles output by the filling machine), the user can configure the associated metadata to define the data tag that triggers an increment of the odometer value (e.g., an input tag or another BIDT representing a "fill cycle complete" event), as well as daily shift start and shift end times between which the value of the Odometer BIDT 606 will increment before being reset to zero. Metadata of an Event BIDT 608 associated with a component of the filling machine can define an input address or data tag representing a state of a device (e.g., a push-button, a photo-sensor, etc.) that determines the event, or an alarm data tag corresponding to an alarm whose state (e.g., Abnormal, Normal, Acknowledged, Unacknowledged, etc.) determines the event.

Figure 8:
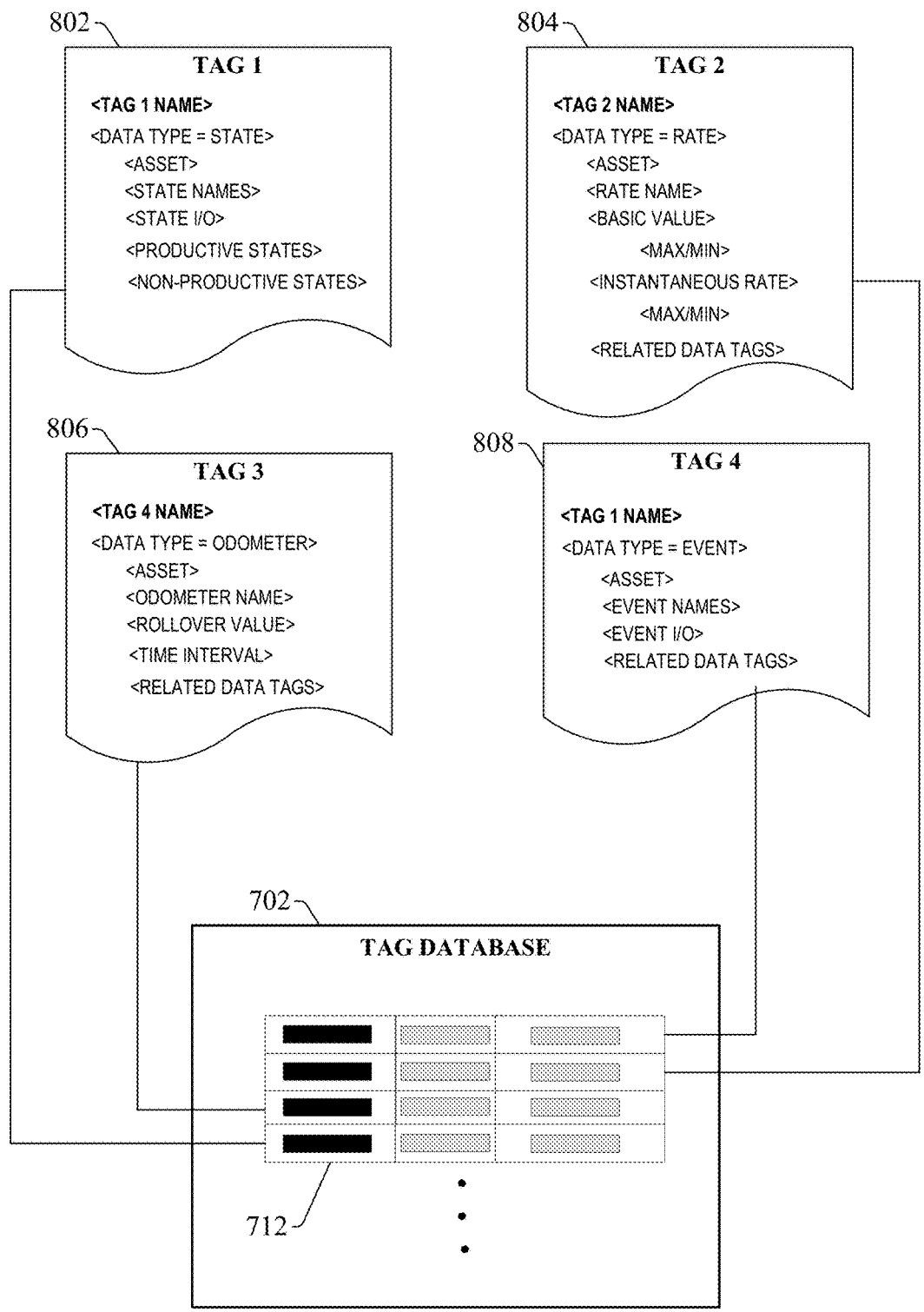
FIG. 8 is a diagram illustrating storage of BIDTs in a tag database.

Once the data tags (both standard and BIDTs) are configured, the tag database 702 stores the configured data tags 712 on memory 320 of industrial device 302, where the data tags 712 are accessible by control program 704. FIG. 8 is a diagram illustrating storage of BIDTs in tag database 702, which shows example data fields for respective types of BIDTs. In the example depicted in FIG. 8, data tag 1 802 is a State BIDT with metadata fields for a name of an industrial asset associated with the tag (e.g., a name of a bottle filling machine, a die cast furnace, a stamping press, etc.), names of the states represented by the tag 802, identification of one or more device inputs or other data tags that determine the states, identification of productive and non-productive states, etc.

Data tag 2 804 is a rate BIDT with metadata fields for an industrial asset name, a name of the rate represented by the rate value (e.g., Line 3 Conveyor Velocity), maximum and minimum values for a basic rate value and/or for an instantaneous rate, related data tags whose values are aggregated to obtain the rate value, a unit for the rate value, or other such metadata fields. Data tag 3 806 is an Odometer BIDT with metadata fields for an asset name, a name of the odometer value (e.g., Bottles Filled, #4 Die Cast Energy Consumption, etc.), a rollover value representing a value of the odometer value at which the value will return to zero, a time interval during which the odometer value is to be incremented (e.g., a start and end time corresponding to a work shift), one or more related data tags that trigger an increment of the odometer value, a unit associated with the odometer value, or other such metadata fields. Data tag 4 808 is an Event BIDT with metadata fields for an asset name, names one or more events represented by the Event BIDT, identification of one or more inputs or data tags that determine the event, or other such metadata data fields.

It is to be appreciated that the metadata fields described above in connection with FIG. 8 are only intended to be exemplary, and that the metadata for a BIDT can have any suitable set of data fields that allow the user to align the BIDT with the industrial application carried out by the industrial device 302.

Figure 9:
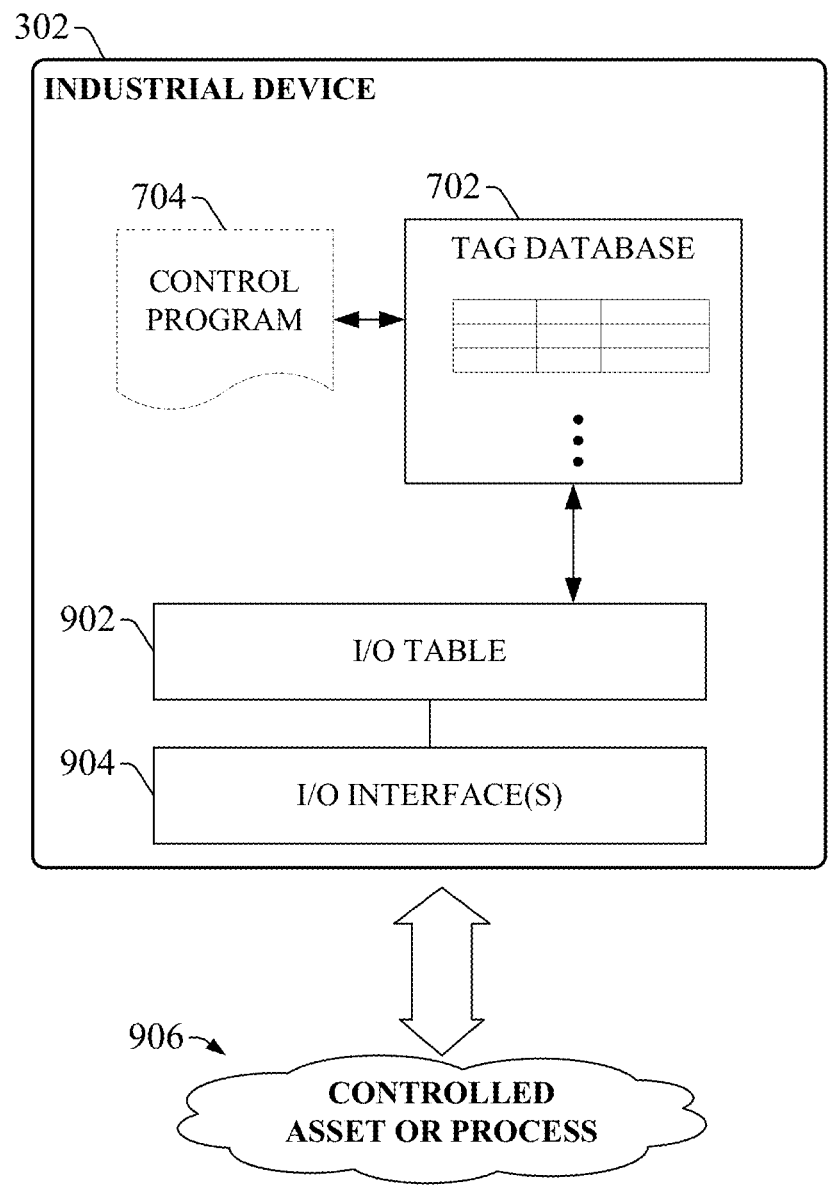
FIG. 9 is a diagram illustrating runtime operation of an example industrial device that supports BIDTs.

After industrial device 302 has been programmed and configured (including creation of any BIDTs to be used by the control program 704), the industrial device 302 can be deployed on the plant floor to facilitate control of one or more industrial assets or processes. FIG. 9 is a diagram illustrating runtime operation of an example industrial device 302 that supports BIDTs. In this example, industrial device 302 is assumed to be an industrial controller (e.g., a PLC or other type of programmable automation controller). Controlled asset or process 906 can represent any industrial machine, production line, process, or operation under the control of industrial device 302. Controlled asset or process 906 can have a number of associated input and output devices (e.g., industrial devices 204 of FIG. 2) that receive command signals from or send telemetry data to industrial device 302 over any suitable combination of hardwired or networked connectivity to regulate a controlled operation. Industrial device 302 can also include one or more I/O interfaces 904 that provide hardwired or networked connectivity to the controlled equipment and industrial devices associated with the controlled asset or process 906. These I/O interfaces 904 can include, for example, digital and/or analog input modules, digital and/or analog output modules, networking modules, or the like.

An I/O table 902 within the industrial device's memory 320 can maintain current analog and digital values of the various inputs and outputs read from or written to the I/O interfaces 904. That is, data signals read from field devices by I/O interfaces 904 (e.g., analog or digital input modules) can be written to the I/O table 902 (e.g., by I/O control component 306). Some or all of these input values can be linked to respective data tags (standard or BIDT data tags) maintained in tag database 702, which can be read by control program 704 or by external applications. These input values can then be read from the appropriate data tags by control program 704, which updates its control variables accordingly. Similarly, output values generated by the control program 704 can be written to output data tags defined in tag database 702, causing the corresponding output registers of I/O data table 902 to be updated. The I/O control component 306 then generates appropriate analog or digital output signals at the output points of I/O interfaces 904 in accordance with the updated output values. It is to be appreciated that this overview of industrial controller functionality is only intended to be exemplary, and that the BIDTs described herein can be implemented on other types of industrial controllers having different data update processes, or on different classes of industrial devices.

Figure 10:
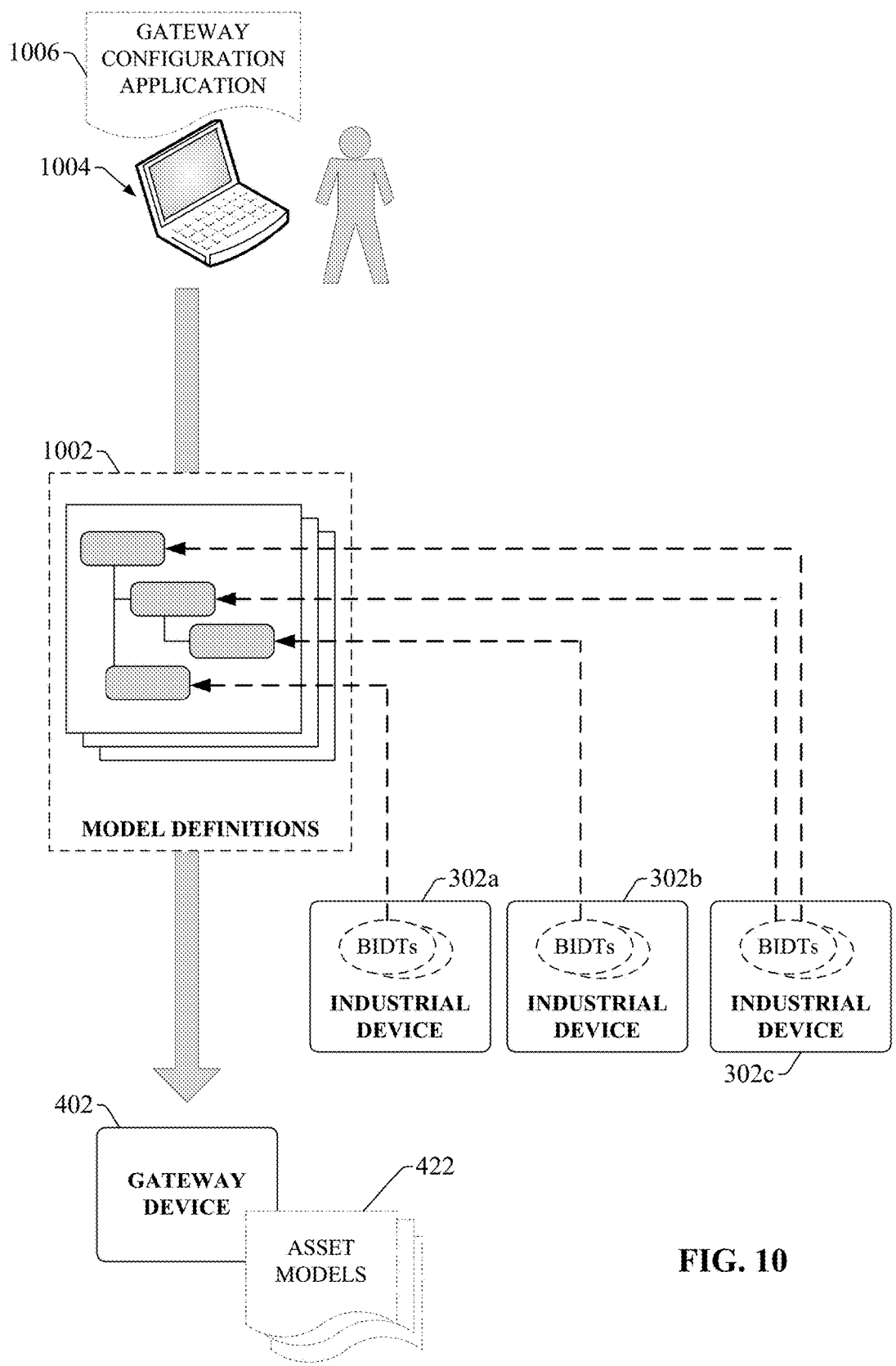
FIG. 10 is a diagram illustrating configuration of a gateway device with one or more asset model definitions.

BIDTs in tag database 702 are discoverable by external systems, so that the BIDT data—with associated metadata customized in accordance with the industrial application carried out by industrial device 302—can be retrieved and organized by those external systems in accordance with user-defined asset and/or plant models. In one or more embodiments, a gateway device 402 can be used to collect, format, and present data from one or more BIDT-capable industrial devices 302. FIG. 10 is a diagram illustrating configuration of a gateway device 402 with one or more asset model definitions. Gateway device 402 can be configured using a gateway configuration application 1006 that executes on a client device 1004 (e.g., a laptop computer, a desktop computer, a tablet computer, etc.). In some embodiments, gateway configuration application 1006 can be an integrated tool of device configuration application 708 used to program and configure industrial device 302.

Gateway configuration application 1006 allows a user to define an asset structure or model of an industrial automation application or a collection of industrial automation applications being monitored and controlled by one or more BIDT-capable industrial devices 302. These asset models define hierarchical relationships between industrial assets, associated industrial devices, production lines or areas, and data generated by the various devices associated with the industrial applications. Using gateway configuration application 1006, a user can define these asset models as model definitions 1002, which can be downloaded to and stored on gateway device 402 as asset models 422.

To facilitate creation of the model definitions 1002, gateway configuration application 1006 can be configured to generate and render suitable configuration screens on client device 1004 that guide the user through the process of defining these asset models 422 for their own industrial applications. The model definitions 1002 can be defined to reference the BIDT data tags defined on one or more industrial devices 302. In particular, the model definitions 1002 can define, as nodes of the hierarchy, hierarchical elements of an industrial asset or collection of assets, and assign selected groups of BIDT data tags to respective elements with which the BIDT data tags are associated (e.g., a node associated with an industrial asset, a unit of equipment associated with the asset, or an industrial device associated with the asset). The asset models 422 are thereby configured by the user to associate the respective BIDTs with selected industrial machines, devices, production lines, and/or plant facilities, as well as to define hierarchical relationships between these elements.

In embodiments in which gateway configuration application 1006 is an integrated tool of device configuration application 708, model building tools of the gateway configuration application 1006 can allow the user to build the model definitions 1002 by browsing to selected BIDTs defined in one or more industrial device configuration files (e.g., the configuration files that are downloaded to the industrial devices 302, and which define the control program 704 and tag database 702). The user can create nodes representing an industrial facility, production lines or areas within the industrial facility, industrial assets (e.g., industrial machine, industrial robots, etc.) within each production line, units of equipment associated with a given industrial asset (e.g., a loader, a pusher, a machining station, etc.), and/or industrial devices (e.g., controllers, drives, etc.) associated with each industrial asset. Selected BIDTs defined on respective industrial devices 302a, 302b, and 302c can then be associated with respective nodes defined in the model definitions 1002 to yield an asset model 422, which can be downloaded to gateway device 402. The asset model 422 allows the user to define a hierarchical asset or plant architecture, and to group BIDTs within the framework in association with selected nodes representing plant production areas or production lines, industrial assets, and/or equipment and devices associated with the assets.

Figure 11:
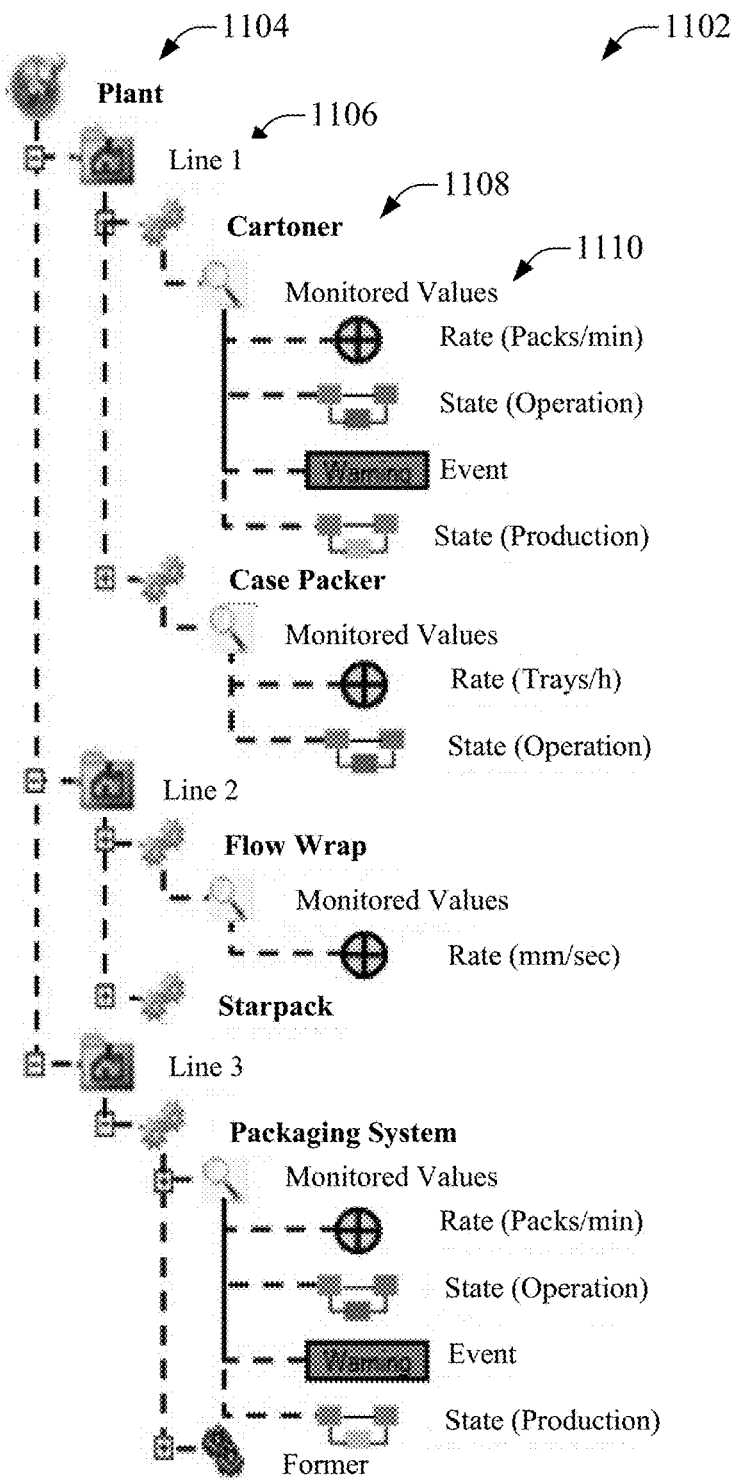
FIG. 11 is a graphical representation of an example asset model formatted as a production model.

Asset models 422 defined on gateway device 402, working in conjunction with the BIDTs defined on industrial devices 302, contextualize data generated by industrial applications and facilitate generation of contextualized data presentations. For a given industrial application, multiple asset models 422 can be created and maintained on gateway device 402, where each asset model 422 can represent a different view of the industrial application. The different views represented by the asset models 422 can be customized to the needs of a particular user role. For example, one asset model 422 for a given industrial application may represent a production model view of the industrial application. FIG. 11 is a graphical representation of an example asset model formatted as a production model 1102. Example production model 1102 has a single plant node 1104, below which are multiple line nodes 1106 (Line 1, Line 2, and Line 3), which are child nodes relative to plant node 1104. Line nodes 1106 represent various production lines within the plant represented by plant node 1104. Each line node 1106 has a number of child machine nodes 1108 representing machines deployed on the line represented by the associated line node 1106 (e.g., Cartoner, Case Packer, Flow Wrap, Packaging System). Each machine node 1108 is associated with a number of monitored values 1110, which are data values obtained from corresponding BIDTs configured on an industrial device 302. The monitored values 1110 may correspond to production and operation statistics, such as a production rate (obtained from a Rate BIDT), operation and production states (obtained from State BIDTs), or line events (obtained from Event BIDTs). As can be seen in FIG. 11, various groups of BIDT data tags—represented by the monitored values 1110—are respectively assigned to a selected machine and line within the plant, as defined by the asset model definition. This example production model 1102 yields a view of the industrial facility (comprising Lines 1, 2, and 3) that may be suitable for an operator or shift manager responsible for daily operation of the lines.

Figure 12:
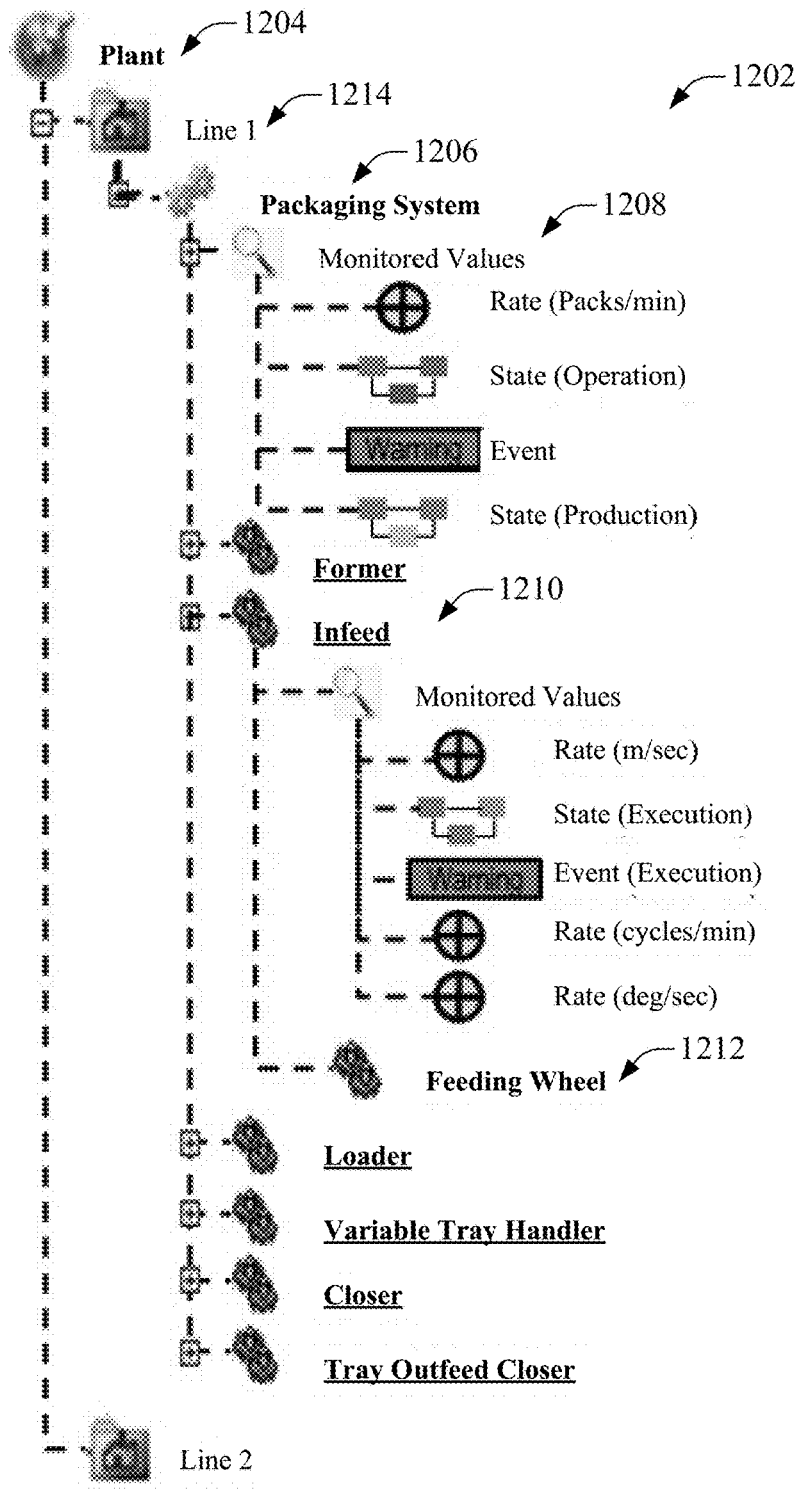
FIG. 12 is a graphical representation of an example asset model formatted as a design model.

FIG. 12 is a graphical representation of an example asset model formatted as a design model 1202. Design model 1202 is configured to present a view of data from the industrial application in a contextualized manner suitable for a plant engineer, original equipment manufacturer (OEM), or system designer. Similar to production model 1102, design model includes a plant node 1204 with a number of child line nodes 1214. In this example, child nodes for each line node 1214 can include machine nodes 1206 (e.g., Packaging System) representing a machine of the line represented by the line node 1214, as well as stage nodes 1210 representing individual stages of the machine (e.g., Former, Infeed, Loader, etc.). Each machine node 1206 can be associated with monitored values 1208 (obtained from BIDTs configured on relevant industrial device 302) relating to production and operation of the machine. Each stage node 1210 can be associated with monitored values (also obtained from respective BIDTs) representing current operating statistics for that stage of the machine. Some stage nodes 1210 may also have child nodes representing individual equipment components of that stage (e.g., equipment node 1212, which represents a finding wheel that is a part of the infeed). As with the production model 1102 depicted in FIG. 11, a user can configure design model 1202 by defining the various hierarchical nodes of the model, and assigning selected groups of BIDT tags (the monitored values) to selected nodes of the model. The system allows the user to define the nodes of the model according to any user-defined hierarchical plant or enterprise structure, where the structure can comprise hierarchical levels defined by the user (e.g., production lines, production cells, production stations, etc.).

It is to be appreciated that the production model 1102 and design model 1202 described above are only intended to be exemplary, and that the asset models described herein are not limited to these two types of views. In general, any suitable user-defined asset model 422 that leverages data from the BIDTs to present a contextualized view of industrial asset data is within the scope of one or more embodiments of this disclosure.

As can be seen in the example asset structure models of FIGS. 11 and 12, the BIDTs are properties of their associated parent nodes. For example, the monitored values 1110 of the Cartoner machine—which are obtained from respective BIDT data tags on one or more industrial devices 302—are properties of the Cartoner product node 1108. During model development, the user can define the various plant nodes, line nodes, product nodes, equipment nodes, or other types of nodes that make up an industrial enterprise as a whole, or a particular set of industrial applications within the industrial enterprise, and define the hierarchical relationships between these nodes. The user can then assign selected BIDTs to their appropriate nodes to yield the asset model, which can be downloaded and stored on the gateway device 402.

The BIDT publishing component 310 of each industrial device 302 exposes the BIDTs of the industrial device 302 to the asset models 422 defined on the gateway device 402. Thus, when the gateway device 402 is deployed on a plant network or on a cloud platform having secured remote access to the industrial devices 302, the asset models 422 can cause the gateway device 402 to retrieve data from the respective BIDTs as well as the metadata parameters associated with each BIDT in order to generate contextualized presentations of the industrial application data in accordance with the asset models 422.

Figure 13:
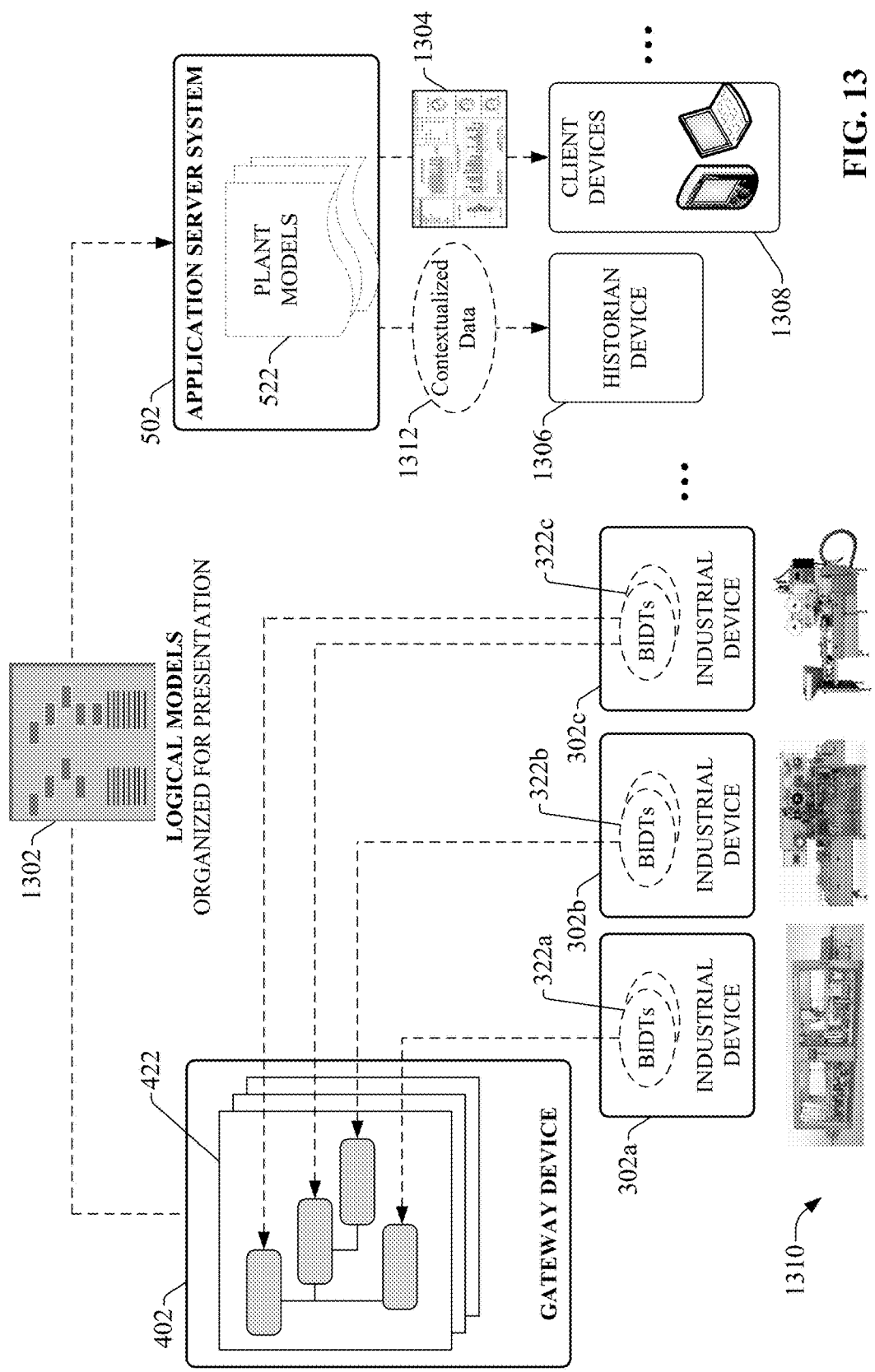
FIG. 13 is a diagram illustrating the flow of BIDT data from industrial devices to an application server system that delivers contextualized presentations of the BIDT data.

FIG. 13 is a diagram illustrating the flow of BIDT data from industrial devices 302 to an application server system 502 that delivers contextualized presentations of the BIDT data. In this example, multiple industrial devices 302 (e.g., 302a, 302b, and 302c) have been programmed to control respective industrial assets 1310 (e.g., industrial machines, production lines, etc.). Each industrial device 302 has been configured with a number of BIDTs 322, as described above in connection with FIGS. 6-9. A gateway device 402 has been configured with a number of asset models 422, as described above in connection with FIGS. 10-12. Asset models 422 define respective customized views of the BIDT data.

During operation, industrial devices 302a-302c monitor and control their respective industrial assets 1310 (e.g., via respective input and output devices associated with the respective industrial assets 1310). Gateway device 402 is networked to the respective industrial devices 302a-302c. For example, gateway device 402 may be an on-premise device that resides on the same plant network as industrial devices 302a-302c. In another implementation, gateway device 402 may reside on a cloud platform and is capable of securely accessing the plant network from the cloud platform (e.g., through a firewall device).

The BIDT publishing component 310 of each industrial device 302 exposes the data and metadata associated with each configured BIDT 322 to the gateway device 402, rendering the BIDT data and metadata accessible and retrievable by the discovery component 406 of the gateway device 402. For each model 422 defined on gateway device 402, the model configuration component 408 of the gateway device 402 retrieves the data and metadata for each BIDT referenced by the model 422 (as specified by the user-defined model definitions 1002) and creates a logical model 1302 of the data based on the model 422 and the BIDT data and metadata. Logical model 1302 organizes the data from the BIDTs in accordance with the hierarchical asset models 422 defined by the user.

Gateway device 402 includes an application server interface component 410 (see FIG. 4) that communicatively connects the gateway device 402 to an application server system 502. Although application server system 502 is depicted in FIG. 13 as being a separate system relative to gateway device 402, in some embodiments the application server system 502 can be an integrated application of the gateway device 402. Application server system 502 is configured to receive the logical model 1302 from gateway device 402, and serve data display presentations 1304 to authorized client devices 1308. For example, the presentation component 508 of application server system 502 can generate an application view of the BIDT data based on the logical model and associated BIDT data and metadata received from the gateway device 402, and the destination interface component 510 of the application server system 502 sends this application view to one or more client devices 1308 as data display presentation 1304. In some scenarios, application server system 502 can also store selected subsets of the contextualized data 1312 in a historian device 1306 that is integrated with or communicatively connected to application server system 502.

Figure 14:
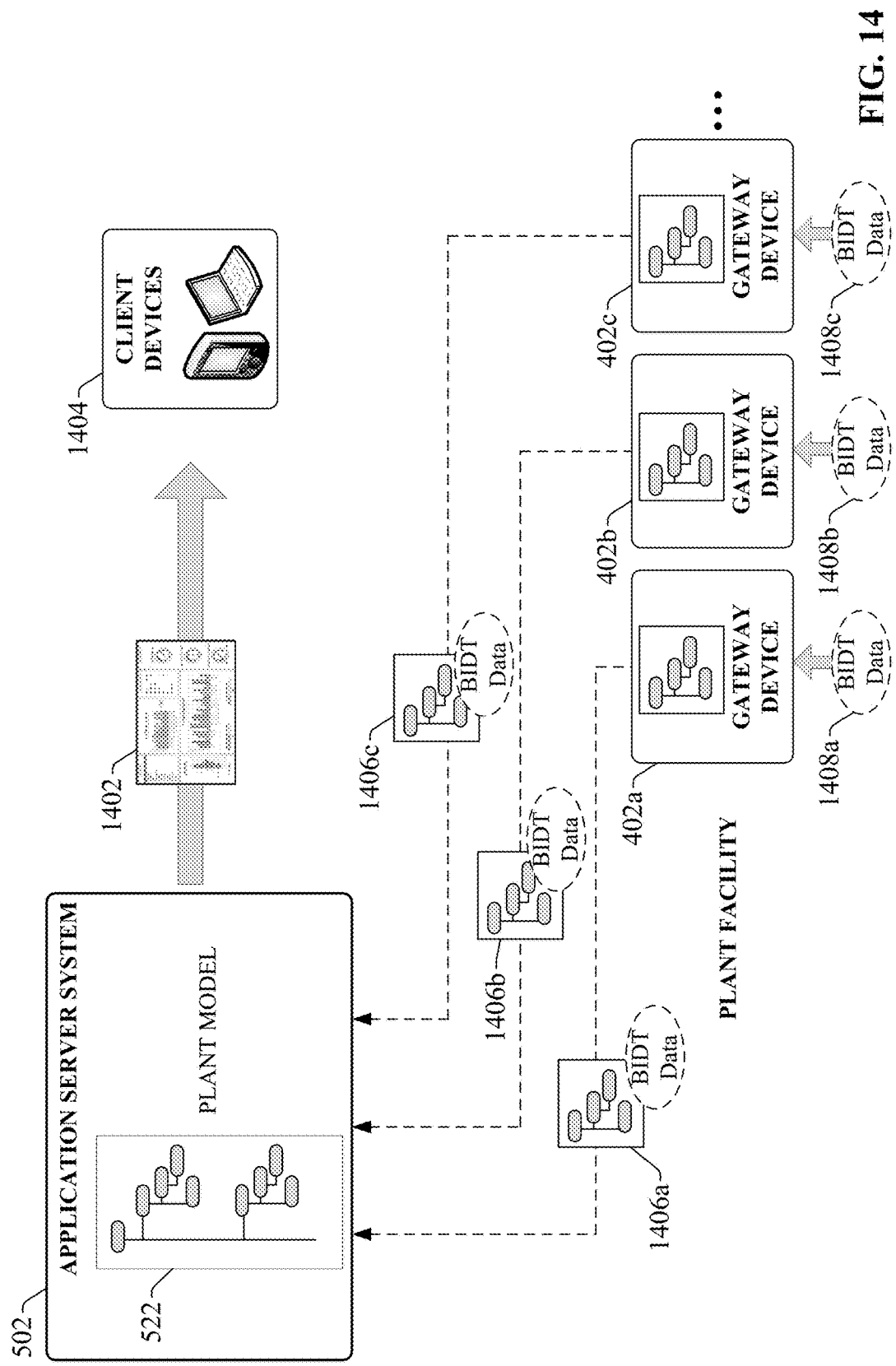
FIG. 14 is a diagram illustrating collection and integration of logical asset models into a common plant model by an application server system.

Data display presentations 1304 can present the contextualized data from the BIDTs in a format that generally aligns with the plant and asset hierarchy defined by the asset models 422. In the example depicted in FIG. 13, the application server system 502 is depicted as receiving logical models 1302 and BIDT data and metadata from a single gateway device 402 that receives and contextualizes BIDT data from multiple industrial devices 302a-302c. As illustrated in FIG. 14, in some embodiments application server system 502 can be configured to collect logical models 1302 and BIDT data and metadata from multiple gateway devices (e.g., gateway devices 402a-402c), and integrate the logical models 1302 into a common plant model 522. In an example implementation, gateway devices 402a-402c may reside at different areas of a given plant facility, and application server system 502 can be either an on-premise device or a cloud-based system that receives the defined asset models 1406a-1406c from the respective gateway devices 402a-402c, together with the data and metadata from the BIDTs defined on each gateway device 402a-402c. In another example implementation, gateway devices 402a-402c may reside at different geographically diverse industrial facilities whose plant and/or office networks are linked to a cloud platform on which application server system 502 executes.

Gateway devices 402a-402c collect BIDT data 1408a-1408c from respective industrial devices (not shown in FIG. 14), as described in previous examples. Each of the gateway devices 402a-402c is configured with one or more asset models 1406a-1406b, as also discussed above. The application server system 502 retrieves the asset models 1406a-1406c from the respective gateway devices 402a-402c, and the plant model component 506 of the application server system 502 integrates the asset models 1406a-1406c into an aggregate plant model 522, which is used as the basis for formatting and presenting the BIDT data via data presentations 1402.

Figure 15:
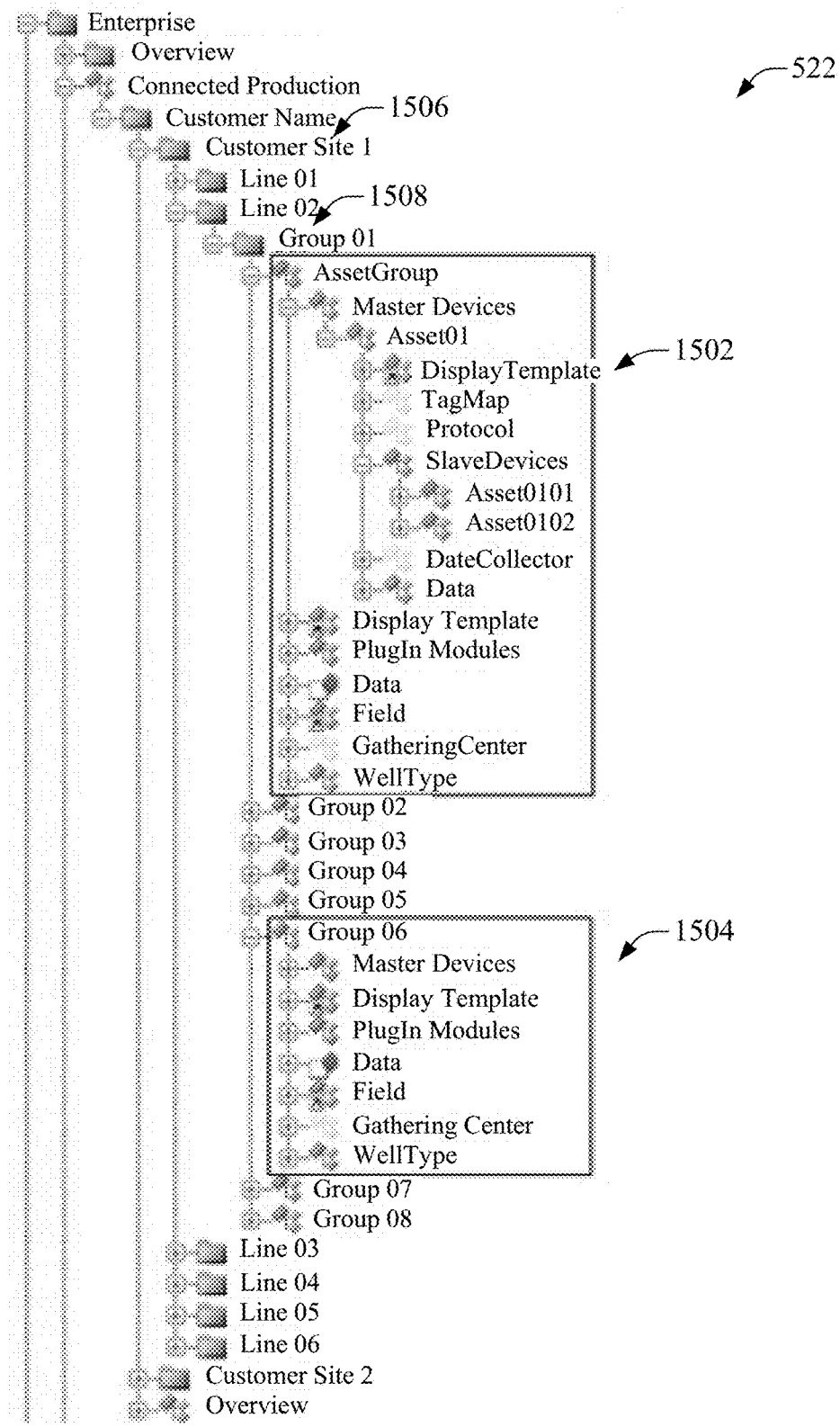
FIG. 15 is an example plant model generated by an application server system by integrating multiple asset models received from respective multiple gateway devices.

FIG. 15 is an example plant model 522 generated by application server system 502 by integrating multiple asset models received from respective multiple gateway devices 402. In this example, the gateway interface component 504 of application server system 502 has discovered two new asset models 1502 and 1504 residing on respective two gateway devices 402, and has integrated models 1502 and 1504 into the larger plant model 522. Asset model 1502 corresponds to an asset group named Group 01, which resides at a plant facility indicated by plant node 1506 (Customer Site 1). Accordingly, the plant model component 506 of application server system 502 has inserted asset model 1502 under an appropriate asset group node 1508 (Group 01) below the plant node 1506. The plant model component 506 can determine the appropriate location at which to connect the asset model 1502 within the plant model 522 based on user-defined context information associated with the asset model 1502 (e.g., an explicit definition of the plant facility and production area within which the asset represented by asset model 1502 resides). As shown in FIG. 15, asset model 1502 defines a master device (Asset01) and a number of slave devices (Asset0101, Asset0102) that make up the asset.

Asset model 1504 represents a second asset located in the same plant facility, customer site, and production line (Line 02). Accordingly, asset model 1504 has been inserted under the same plant node 1506 and production line node (Line 02).

Figure 16:
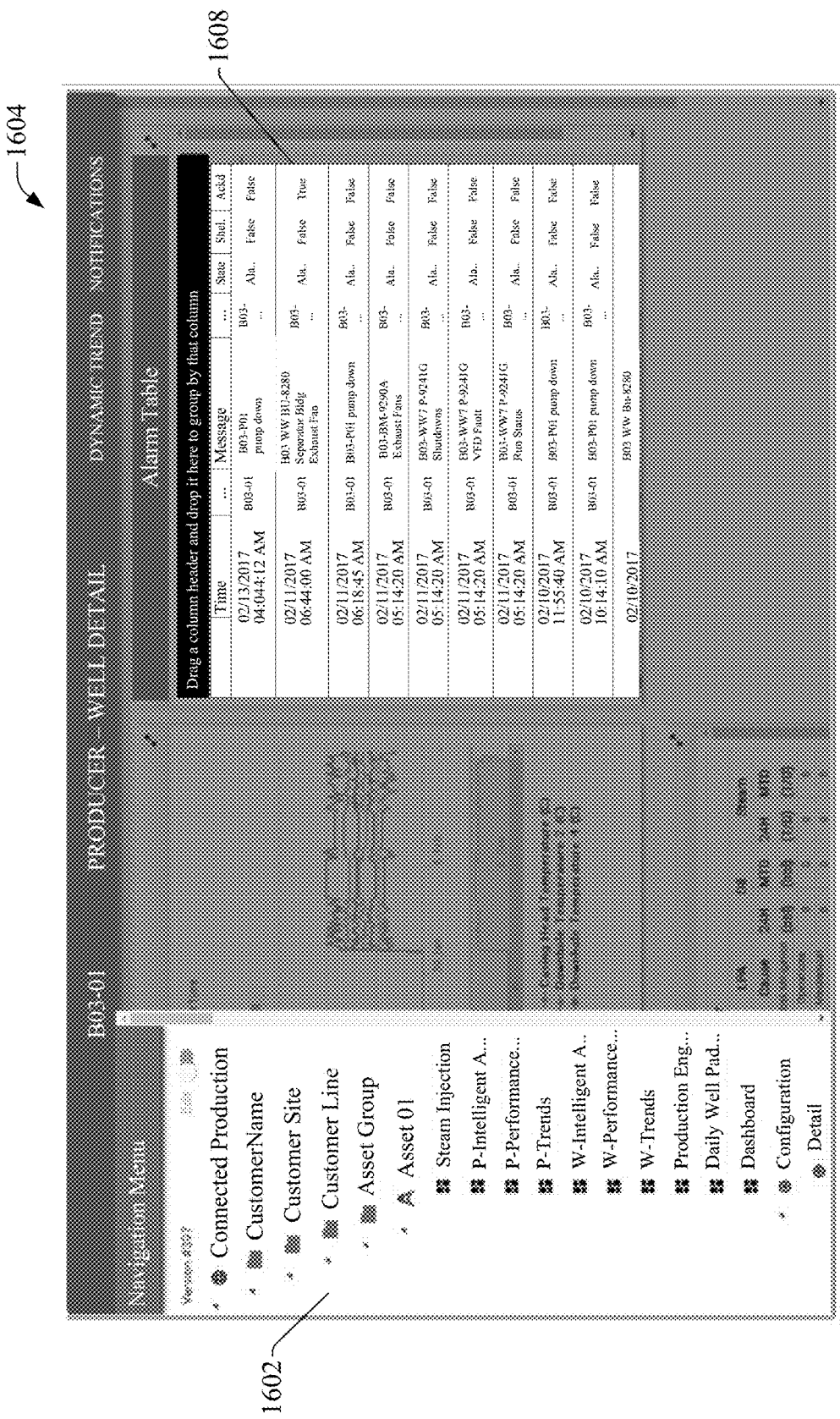
FIG. 16 is a screen shot of an example data presentation that can be generated by a presentation component of an application server system based on an aggregated plant model.

FIG. 16 is a screen shot of an example data presentation 1604 that can be generated by the presentation component 508 of application server system 502 based on the aggregated plant model 522. Example data presentation 1604 includes a navigation menu 1602 having a hierarchical structure that conforms to the hierarchical structure of plant model 522. For example, navigation menu comprises a hierarchical tree structure having nodes representing one or more plant facilities and associated production areas, production lines, industrial assets, and/or industrial devices, as defined by plant model 522. Selection of any of the nodes of the navigation menu invokes a corresponding data presentation on a data display area 1608 of the data presentation 1604. The data display area 1608 renders selected subsets of the BIDT data corresponding to the selected node (e.g., a node corresponding to a production area or production line, an industrial asset, an industrial device, etc.), formatted in accordance with a pre-defined visualization application, graphical widget, or collection of graphical widgets. The visualization application or widgets (e.g., widgets 524) can be stored on application server system 502 and selectively invoked by the presentation component 508 in response to selection of a node from the navigation menu 1602.

In some embodiments, the presentation component 508 of application server system 505 can support different graphical widgets corresponding to respective BIDT types. For example, an odometer widget may be defined for displaying data from an Odometer BIDT (e.g., an integer numerical display widget). Accordingly, when the user selects a node from navigation menu corresponding to a plant, production line, industrial asset, or industrial device having one or more associated odometer BIDT data tags (as defined by the asset model 422), the presentation component 508 can invoke the odometer widget to display the corresponding odometer data on the data display area 1608. The other BIDT data types can likewise be associated with one or more corresponding graphical widgets that can be invoked by the presentation component 508 to display those BIDT data items. Example graphical widgets that can be supported by application server system 502 for rendering of BIDT data can include, but are not limited to, integer or real numerical displays, state or event text displays, bar graphs, line graphs, animated state machine graphics, animated graphical representations of industrial assets whose visual state is dependent on a current state, event, or value reported by a BIDT data tag, or other such widgets.

In some embodiments, presentation component 508 can automatically design a data presentation for display in the data display area 1608 based on the type of industrial asset being viewed and the associated BIDT data types. For example, if a user selects a node corresponding to an industrial machine having an associated Odometer, State, Rate, and Event BIDTs (as defined by the plant model 522 to which the industrial machine belongs), the presentation component 508 can invoke and arrange a collection of graphical presentation widgets that render the associated BIDT data as well as any auxiliary data that may be appropriate. In an example implementation, the presentation component 508 can invoke an appropriate number of BIDT-specific widgets for rendering the state, rate, odometer, and event data, and organize these widgets into a suitable presentation, with each widget or data item appropriately labeled. The presentation component 508 can determine suitable labels for each data item based on one or both of the asset model definitions (e.g., the names assigned to the respective nodes of the asset model 422) or the BIDT metadata (e.g., event or state names, BIDT data tag names, etc.).

The presentation component 508 can also generate and display auxiliary data based on the BIDT data. For example, when a node of the navigation menu 1602 having an associated rate BIDT is selected, the presentation component 508 can display the current rate value using an appropriate graphical widget, as well as a time-based trend graph showing the value of the rate BIDT over time. Similarly, when rendering an event BIDT, the presentation component can render a current event specified by the event BIDT as well as a time-stamped list of most recent events associated with the event BIDT. In order to populate such auxiliary data displays, the application system server can store historical contextualized data 1312 from the BIDTs in a historian device 1306 during operation (see FIG. 13), where the historian device 1306 may be either an integrated storage area of the application server system 502 or a separate historical data storage device. The presentation component 508 can leverage this stored historical (e.g., time-stamped events generated by event BIDTs, historical trend data from rate BIDTs, etc.) in order to populate graphical trends or event logs.

In some embodiments, the application server system 502 can allow the user to customize the data presentations for any of the selectable nodes rendered in the navigation menu 1602. For example, the presentation component 508 can be configured to dynamically design and generate a default presentation for a given node (e.g., industrial asset) based on the types and numbers of BIDTs associated with that node. This can include selecting appropriate widgets for displaying the current values of the BIDTs, selecting additional widgets for displaying auxiliary information for the BIDTs (e.g., historical trends, event logs, etc.), and orienting these widgets on the data display area 1608. The presentation component 508 can also allow the user to modify or enhance these dynamically generated default presentations by moving selected widgets to preferred locations, adding or removing graphical widgets, relabeling data items, etc. These modified presentations can then be saved, such that the presentation component 508 will re-present these customized presentations each time the node is selected.

The format of the presentation generated by presentation component 508 will depend on the asset and/or plant models that are invoked. In some embodiments, different asset models 422 and/or plant models 522 can be associated with different user roles. For example, a production asset model (such as production model 1102 of FIG. 11) may be defined for use by plant operators, while a design asset model (such as design model 1202 of FIG. 12) can be defined for plant engineers or OEMs. When a user accesses application server system 502 to invoke a view of the system, the asset and/or plant models associated with the user can be invoked, and the presentation component 508 can construct the data presentation based on the user- or role-specific model. In an example embodiment, the appropriate asset model can be determined based on log-in credentials of the user. For example, after the user provides a user identifier and any security credentials (e.g., a password, biometric information, etc.) the user's identity can be cross-referenced with a role database maintained on the application server system, and the asset and/or plant model(s) associated with that user role (e.g., operator, engineer, plant manager, OEM, etc.) can be invoked and used as the basis for the data visualization.

It is to be appreciated that the example visualization display depicted in FIG. 16 is only intended to be exemplary, and that any suitable graphical arrangement and presentation of data is within the scope of one or more embodiments of this disclosure.

Also, while the examples described above in connection with FIGS. 14-16 depict the graphical presentations as being generated and delivered by application server system 502, some embodiments of gateway devices 402 can also be configured to generate graphical presentations of the BIDT data based on their stored asset models 422 (using presentation component 412).

Figure 17:
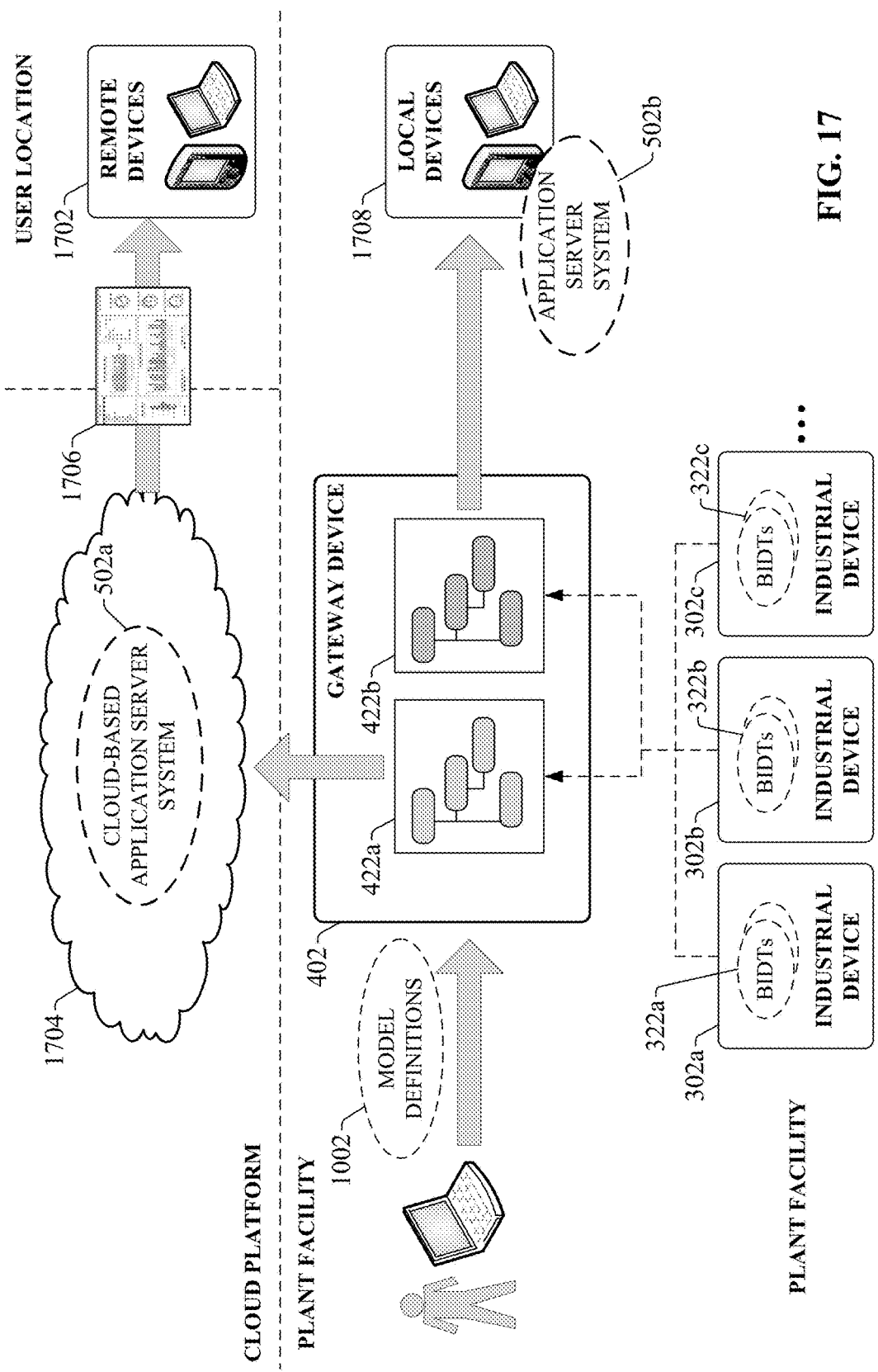
FIG. 17 is a diagram depicting a gateway device on which is defined a first asset model for delivery to a cloud-based application server system, and a second asset model for presentation of BIDT data to local on-premise client devices.

In addition to allowing creation of different asset models 422 that conform to respective presentations of BIDT data suitable for different types of viewers (e.g., operator, OEM, engineer, etc.), some embodiments can also allow different asset models 422 to be defined on a given gateway device 402 that are customized to respective different destination platforms. FIG. 17 is a diagram depicting a gateway device 402 on which is defined a first asset model 422a for delivery to a cloud-based application server system 502, and a second asset model 422b for presentation of BIDT data to local on-premise client devices 1702.

In this example, both asset models 422a and 422b are used to group and contextualize data from BIDTs 322a-322c defined on industrial devices 302a-302c. Asset model 422a is configured for delivery to cloud-based application server system 502a, which executes on a cloud platform 1704 having a remote communication channel to gateway device 402. Cloud-based application server system 502a performs functions similar to the application server systems described above; e.g., receiving asset model 422a and associated BIDT data and metadata from gateway device 402, integrating the asset model 422a into a larger plant or enterprise model (which may comprise asset models from multiple geographically diverse gateway devices 402), and presenting data presentations 1706 conforming to the aggregated plant model to authorized remote client devices 1702 having access to the cloud system serves.

Asset model 422b is configured for delivery to local devices 1708 (e.g., local client devices having integrated application server systems for generation of BIDT data presentations, or a local server device that executes an application server system that serves BIDT data presentations to multiple client devices). Each model 422a and 422b can have associated destination metadata defining the application server systems (which may include either or both of remote and local systems) to which the model is to be exposed. The gateway device 402 will expose and/or deliver each model 422a and 422b to the application server system (e.g., application server system 502a or 502b) defined by the metadata.

Figure 18:
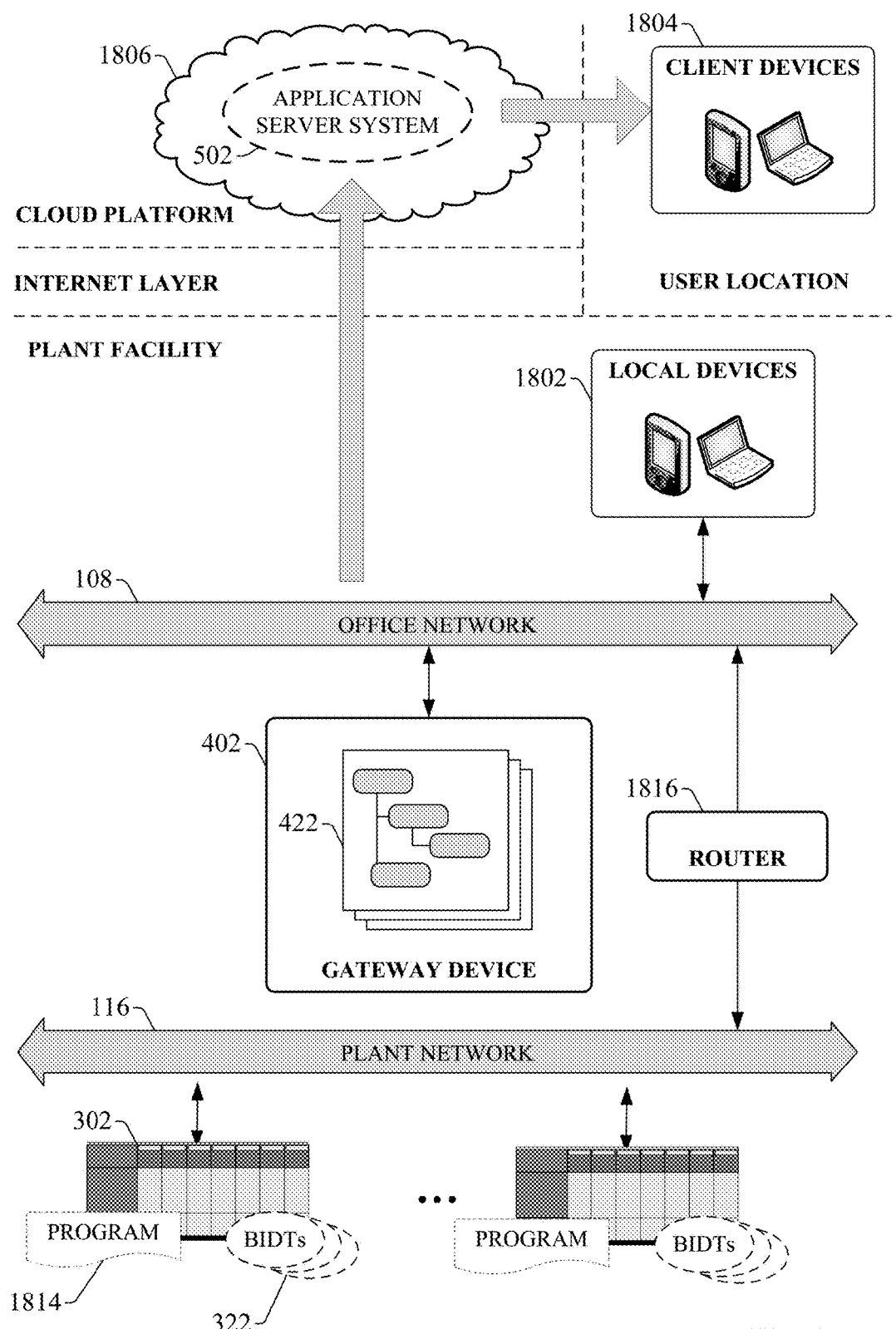
FIG. 18 is a diagram illustrating an example network architecture that includes industrial devices, a gateway device, and a cloud-based application server system.

FIG. 18 is a diagram illustrating an example network architecture that includes industrial devices 302, a gateway device 402, and a cloud-based application server system 502. In this example, industrial devices 302 are industrial controllers that each execute a control program 1814, where a number of BIDTs 322 have been configured on each controller. The industrial devices 302 are connected to a plant network 116 (e.g., a common industrial protocol network, an Ethernet/IP network, etc.) that facilitates data exchange between industrial devices on the plant floor. Plant network 116 may be a wired or a wireless network. In the illustrated example, gateway device 402 resides on a separate office network 108 that is connected to the plant network 116 (e.g., through a router 1816 or other network infrastructure device). However, the gateway device 402 can also be installed directly on the plant network 116 in other implementations, or may connect to each industrial device 302 over a separate wired or wireless connection.

As described in previous examples, gateway device 402 can be configured with one or more asset models 422 that define groupings of BIDTs 322 within a user-defined hierarchical representation of a plant, a production area, and/or an industrial asset. The BIDT publishing component 310 of the industrial devices 302 expose the BIDTs 322 to the gateway device 402 over a communication channel that traverses the plant network 116 and the office network 108 (that is, the BIDT publishing component 310 renders the BIDTs 322 communicatively accessible to the discovery component 406 of the gateway device 402).

In this example, application server system 502 is a cloud-based system that resides on a cloud platform 1806 and executes as a cloud-based service that is accessible to authorized remote client devices 1804 as well as the gateway device 402. Cloud platform 1806 can be any infrastructure that allows shared computing services (such as application server system 502) to be accessed and utilized by cloud-capable devices. Cloud platform 1806 can be a public cloud accessible via the Internet by devices 1804 having Internet connectivity and appropriate authorizations to utilize the application server system 502. In some scenarios, cloud platform 1806 can be provided by a cloud provider as a platform-as-a-service (PaaS), and the application server system 502 can reside and execute on the cloud platform 1806 as a cloud-based service. In some such configurations, access to the cloud platform 1806 and associated application server system 502 can be provided to customers as a subscription service by an owner of the application server system 502. Alternatively, cloud platform 1806 can be a private cloud operated internally by the industrial enterprise (the owner of the plant facility). An example private cloud platform can comprise a set of servers hosting the application server system 502 and residing on a corporate network protected by a firewall.

If cloud platform 1806 is a web-based cloud, the application server interface component 410 of the gateway device 402 may interact with the application server system 502 via a secure Internet connection. In some embodiments, gateway device can also be embodied as an integrated component of a network infrastructure device, such as a network switch, router, or hub. In such embodiments, the network infrastructure device performs the network connectivity functions of a network switch, hub, or router, as well as the functions of the gateway device 402 as described above.

Figure 19:
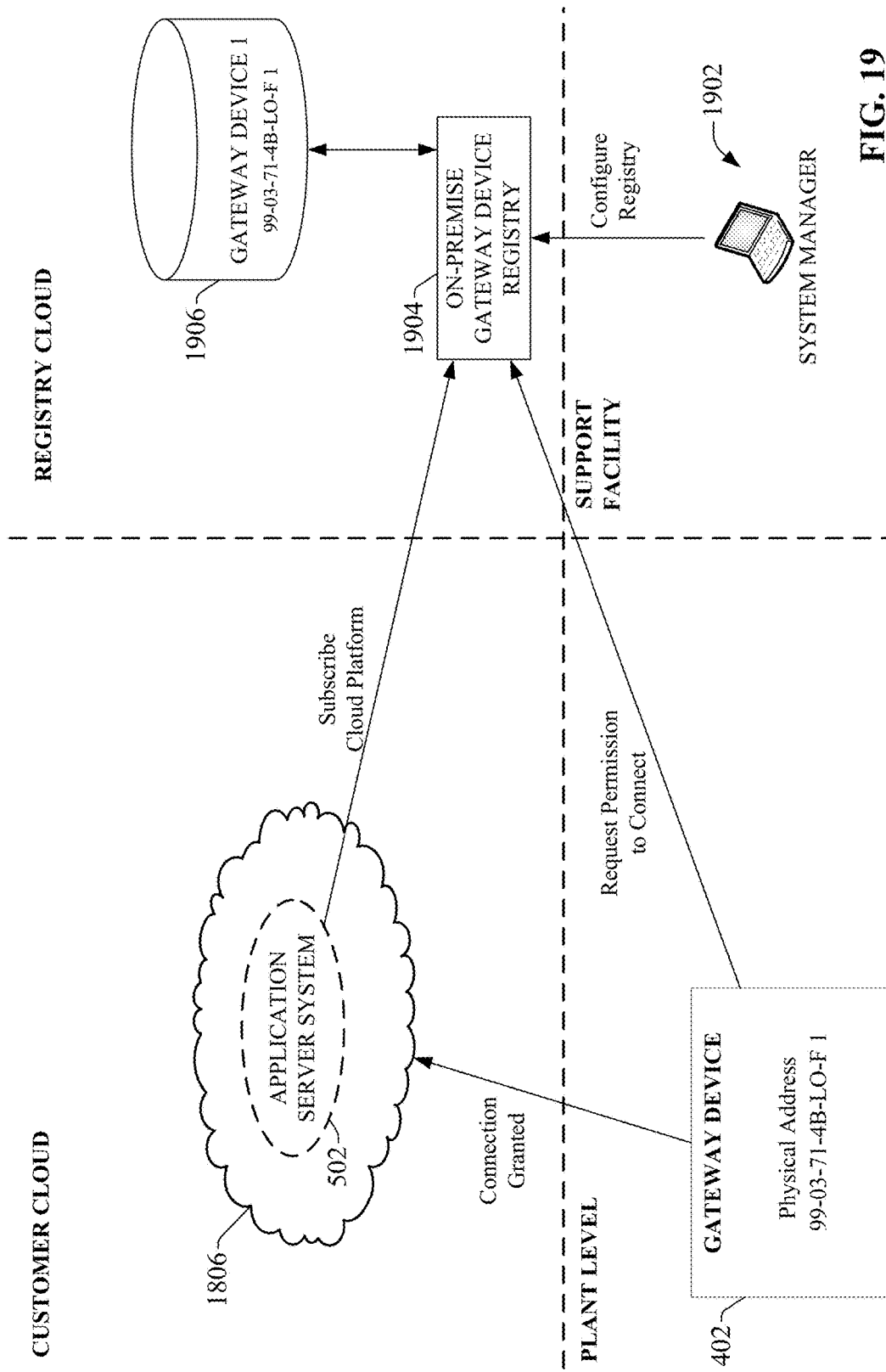
FIG. 19 is a block diagram of an example architecture that utilizes a gateway device registry to manage agent communication to a customer's cloud platform.

In one or more embodiments in which application server system 502 executes on a cloud platform 1806, communication channels between the application server system 502 on the cloud platform 1806 and the gateway device 402 can be managed by a gateway device registry that executes on the cloud platform. FIG. 19 is a block diagram of an example architecture that utilizes a gateway device registry to manage agent communication to a customer's cloud platform 1806. In this example, an on-premise gateway device registry 1904 resides on the same cloud space as the customer cloud platform 1806, but on a separate registry cloud. The registry cloud and the gateway device registry 1904 may be managed by a service provider that offers the customer use of the customer cloud platform as a PaaS (platform as a service). The gateway device registry 1904 can enforce secure access to the customer cloud platform 1806 and ensure that the customer's collected data in the cloud platform 1806 is only accessed by authenticated devices and users. When a new customer cloud platform is established as part of a PaaS agreement, the new customer cloud platform can be subscribed to the gateway device registry 1904 so that gateway device communication with the new cloud platform can be regulated by the registry.

Gateway device 402 may be one of several gateway devices 402 distributed throughout the customer's industrial enterprise. In the example depicted in FIG. 19, gateway device 402 is identified as Gateway Device 1 to distinguish the gateway device 402 from other on-premise gateway devices. Gateway device 402 may have a physical address (e.g., a MAC address or other physical address) that uniquely identifies the gateway device 402. Gateway device registry 1904 stores a record of gateway device 402 in association with the physical address (99-03-71-4B-LO-F 1 in the present example), so that Gateway Device 1 and the physical hardware platform of the gateway device 402 executes are logically linked. This association between Gateway Device 1 and the physical address of the hardware platform of gateway device 402 may be entered into the gateway device registry 1904 by a system manager 1902 at a support facility associated with the cloud service provider. System manager 1902 may also enter other configuration parameters that will be used by the gateway device registry 1904 to manage secure connections to the customer's cloud platform 1806. Configuration information for managing the gateway device's connectivity to the cloud platform 1806 can be maintained in registry storage 1906 on the registry cloud.

When gateway device 402 has BIDT data available to send to the application server system 502, application server interface component 410 of gateway device 402 can send a request to gateway device registry 1904 for permission to create a cloud connector port that will serve as a communication channel between the gateway device 402 and the cloud platform 1806. The request can include, for example, an identification of Gateway Device 1, the physical address of gateway device 402, and an identification of the particular customer-specific cloud platform 1806 to which the connection is requested. The gateway device registry 1904 will grant or deny a certificate to the gateway device 402 for establishing the channel based on information provided in the request. For example, the gateway device registry 1904 may reference registry storage 1906 to confirm that the physical address of gateway device 402 from which the request was received is associated with the particular gateway device (Gateway Device 1) requesting the channel By confirming that the connection request for Gateway Device 1 has been received from the previously registered gateway device 404, the gateway device registry ensures that Gateway Device 1 cannot be used to establish connectivity to the cloud platform 1806 if improperly moved, or if the gateway device installation is copied to another physical hardware platform. If the gateway device configuration is moved from gateway device 402 to a different computing device without registering the new device with gateway device registry 1904, the registry will deny any communication requests originating from the new device on behalf of the gateway device 402.

When the gateway device registry 1904 determines that the connection request is valid (based on information received in the request and previously registered information for Gateway Device 1 in registry storage 1906), the gateway device registry 1904 grants a certificate to the gateway device 402 permitting the gateway device to open a temporary communication channel to the customer cloud platform 1806. Accordingly, a cloud application programming interface (API) managed by the application server interface component 410 of gateway device 402 establishes a communication channel to the cloud platform 1806 and sends the BIDT data and associated metadata to the application server system 502 on cloud platform 1806 as described above in previous examples. In some embodiments, the cloud API assigns an expiration time to the communication channel when the channel is created. The expiration time may be defined by the service providers via cloud device registry 1904 or by the end user via user interface component 414 on the customer end. Typically, the expiration time will be set to exceed an expected duration of time required to send the BIDT data and metadata. If the gateway device 402 has completed transfer of the BIDT data to the cloud platform before the expiration time for the channel has elapsed, the channel can automatically close upon completion of the data transfer or when the expiration time has elapsed. If the gateway device 402 has not completed transfer of the BIDT data and metadata to the cloud platform by the time the expiration time has elapsed, the gateway device 402 may perform additional handshaking with the gateway device registry 1904 requesting re-enablement of the channel to allow completion of the data transfer.

The example sequence described above in connection with FIG. 19 for ensuring secure communication and access to the cloud platform 1806 by authorized registered gateway devices is only intended to be exemplary, and it is to be appreciated that any suitable protocol or architecture for establishing secure communication and BIDT data transfer between the gateway device 402 and a cloud-based application server system 502 is within the scope of one or more embodiments of this disclosure.

The basic information data types and associated services described herein can simplify creation of customized industrial data visualization presentation using an elegant, adaptable, and scalable architecture. A given industrial asset, collection of assets, or industrial application can be described in terms of customized BIDTs at the controller level. Asset models can be created that define the industrial assets in terms of user-defined groupings of these BIDTs, where multiple different asset models can be defined that are customized for respective different user roles or views. These asset models, together with data and metadata associated with this BIDTs, are used to generate graphical presentations of the asset data that are structured in accordance with the models. An application server system can render the BIDT data on these presentations using suitable graphical widgets or other graphical elements, which may include widgets that are specific to a given type of BIDT (e.g., state, rate, odometer, event, etc.). As industrial assets are added, removed, or modified, the associated asset models can be reconfigured to add, remove, modify, or re-locate nodes, and the data presentations will be updated accordingly. The BIDTs are discoverable by a gateway device that maintains the asset models, so that newly added BIDTs instantiated on an industrial controller or other industrial device can be easily integrated into the asset models and associated graphical data presentations.

Figure 20:
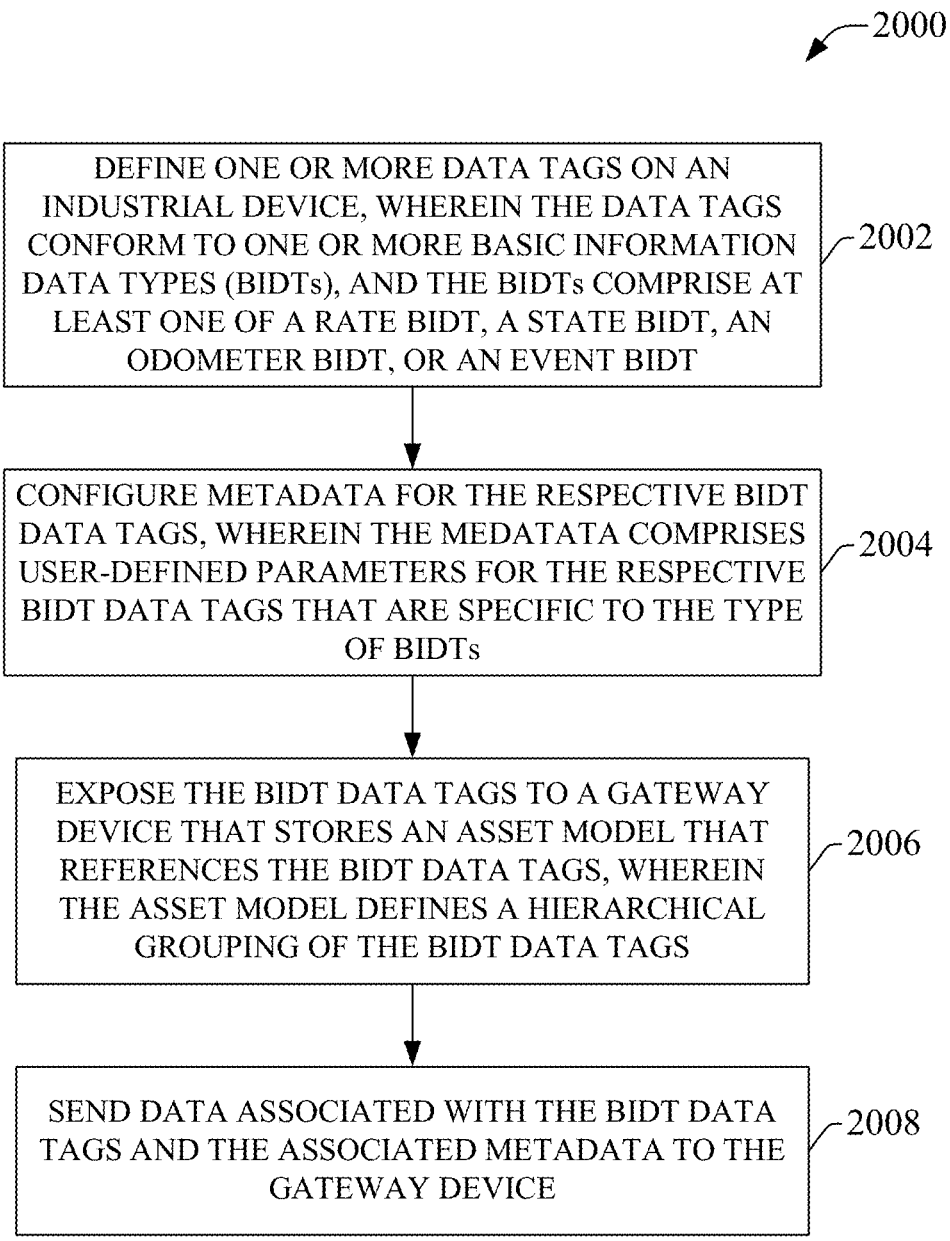
FIG. 20 is a flowchart of an example methodology for configuring and utilizing BIDT data tags in an industrial controller for delivery of industrial data to a visualization system.
Figure 21:
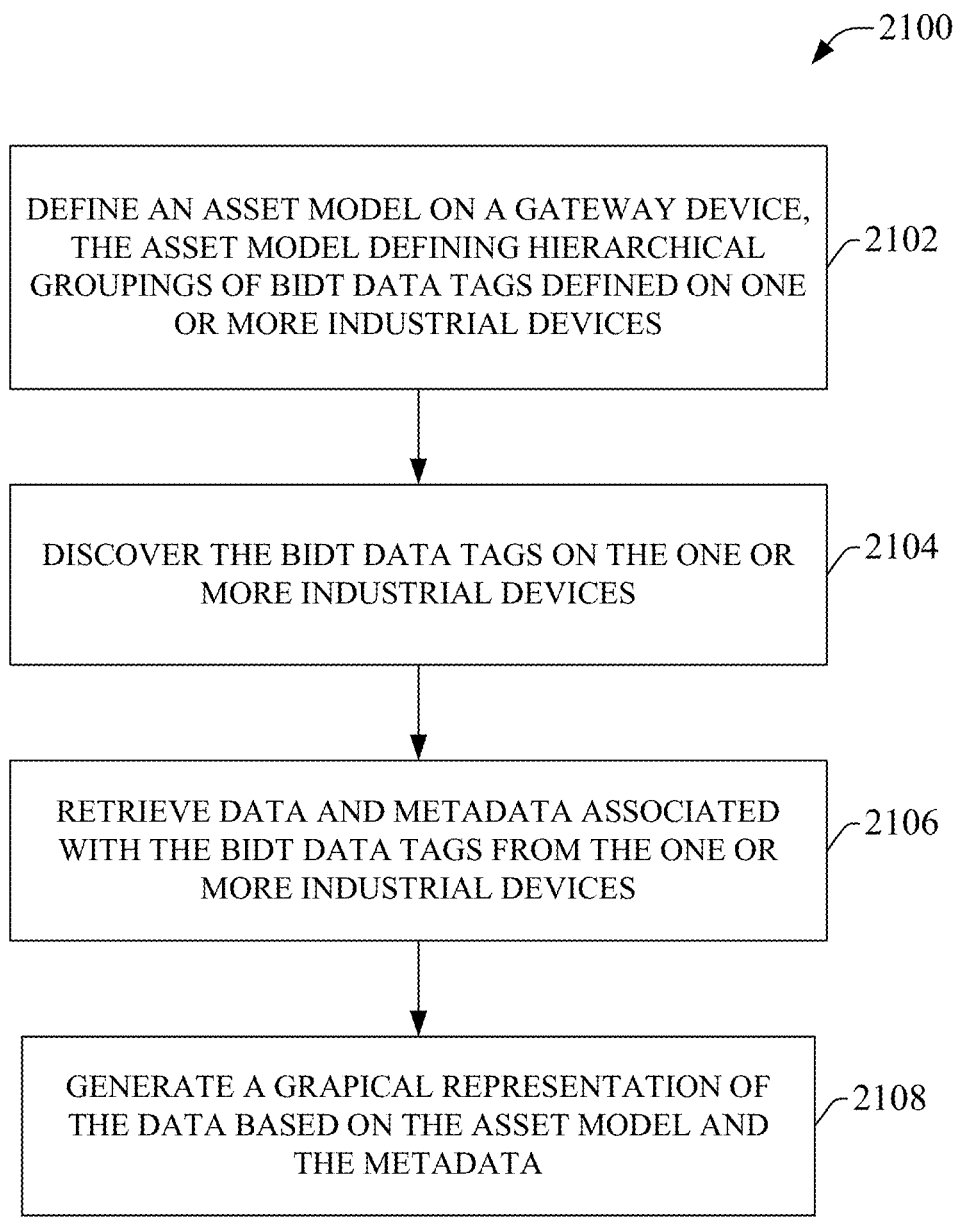
FIG. 21 is a flowchart of an example methodology for discovering and retrieving data from BIDT data tags in accordance with an asset model.
Figure 22:
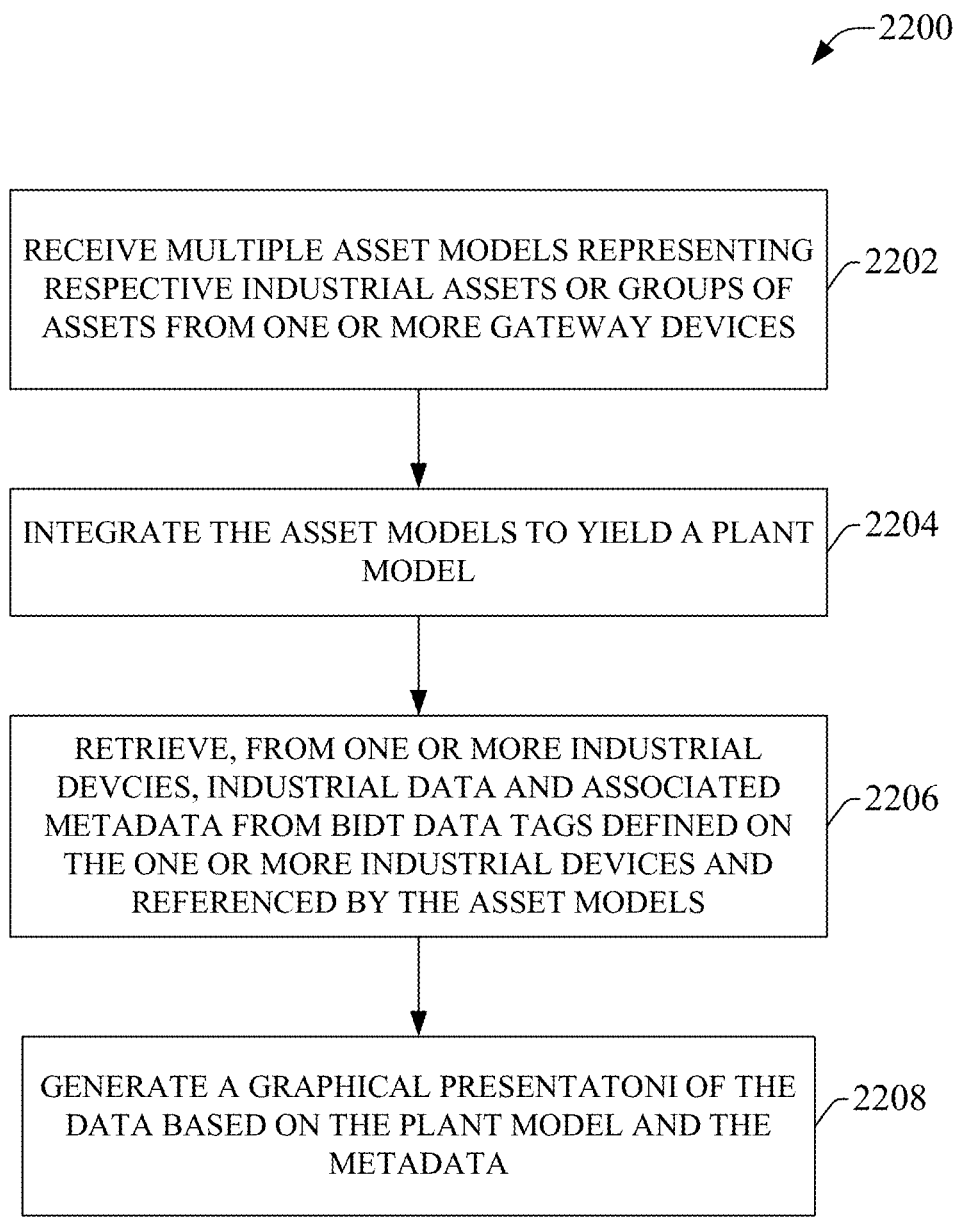
FIG. 22 is a flowchart of an example methodology for aggregating asset models and using the aggregated model to generate graphical presentations of industrial data.

FIGS. 20-22 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 20 illustrates an example methodology 2000 for configuring and utilizing BIDT data tags in an industrial controller for delivery of industrial data to a visualization system. Initially, at 2002, one or more data tags are defined on an industrial device, where the data tags conform to one or more basic information data types (BIDTs), and the BIDTs comprise at least one of a rate BIDT, a state BIDT, an odometer BIDT, or an event BIDT. Rate BIDT data tags can represent an integer or real value of a measured rate of a metric associated with the industrial asset or device. State BIDT data tags can represent a current state of an industrial asset or device (e.g., a machine, a production line, a motor drive, etc.). Odometer BIDT data tags can represent cumulative quantities associated with an industrial asset (e.g., a cumulative quantity with a rollover value, or a quantity over a defined time interval). Event BIDT data types can represent instantaneous or persistent event associated with an industrial asset (e.g., a push-button event, a sensor event, a safety device event, and alarm event, etc.).

At 2004, metadata is configured for the respective BIDT tags defined at step 2002. The metadata comprises user-defined parameters for the respective BIDT data tags, where the user-defined parameters are specific to the type of each BIDT data tag. For example, user-configurable metadata associated with a Rate BIDT data tag can include, but is not limited to, definitions of maximum and minimum values for the corresponding rate value, identities one or more other data tags or input addresses whose values are aggregated (e.g., summed, averaged, integrated, etc.) to yield the rate value, units of measure associated with the rate value, or other such metadata. Metadata for a state BIDT data tag can include, but is not limited to, definitions of the available states of an industrial asset to which the data tag is assigned, identities of one or more other data tags whose values determine the state, or other such metadata. Metadata associated with an odometer BIDT can include, but is not limited to, identities of one or more data sources that drive the odometer value, identities of two or more data tags whose values are to be aggregated or summed to yield the odometer value, units of measure associated with the odometer value (e.g., a product count, megawatt-hours consumed, etc.), or other such metadata. Metadata associated with an event BIDT data tag can include, but is not limited to, identities of other data tags or device input addresses whose states, in aggregation, determine the event to be represented by the Event BIDT data tag, names of the events represented by the event BIDT data tag, or other such metadata.

At 2006, the BIDT data tags are exposed to a gateway device networked to the industrial controller, where the gateway device stores an asset model that references the BIDT data tags, and the asset model defines a hierarchical grouping of the BIDT data tags. The asset model defined on the gateway device can correspond to a desired hierarchical organization of industrial asset or application data that can be used to generate customized graphical presentations of the asset data. At 2008, data associated with the BIDT data tags and the metadata defined for the BIDT data tags are sent to the gateway device, where the data and metadata are used to generate a graphical presentation of the BIDT data in accordance with the asset model.

FIG. 21 illustrates an example methodology 2100 for discovering and retrieving data from BIDT data tags in accordance with an asset model. Initially, at 2102, an asset model is defined on a gateway device, where the asset model defines hierarchical groupings of BIDT data tags defined on one or more industrial devices. The asset model can define a hierarchical arrangement of plant elements—e.g., plant facilities, production areas or lines, industrial assets, industrial equipment or devices that make up an industrial asset, etc.—and map selected BIDT data tags to respective elements of the hierarchy.

At 2104, the BIDT tags referenced by the asset model defined at step 2102 are discovered on the one or more industrial device by the gateway device. This can involve discovering the BIDT data tags over a network (e.g., a wired and/or wireless plant network, a public network such as the internet, etc.). At 2106, data from the BIDT data tags is retrieved by the gateway device from the one or more industrial devices, together with metadata associated with the BIDT data tags. At 2108, a graphical representation of the data retrieved at step 2106 is generated based on the asset model and the BIDT metadata. In some embodiments, the presentation can include a browsable navigation menu having a hierarchical structure similar to that defined by the asset model, where selecting of an element from the hierarchical navigation menu (e.g., a production line, an asset, an item of equipment, an industrial device, etc.) invokes and arranges one or more graphical widgets or other graphical elements for display of BIDT data associated with the selected element.

FIG. 22 illustrates an example methodology 2200 for aggregating asset models and using the aggregated model to generate graphical presentations of industrial data. Initially, at 2202, multiple asset models representing respective industrial assets or groups of assets are received from one or more gateway devices. As in previous examples, the asset models define groupings of BIDT data tags within hierarchical organizations of plant elements.

At 2204, the asset models are integrated (e.g., at an application server system) to yield a plant model, which defines a hierarchical plant or enterprise structure comprising multiple industrial assets. At 2206, industrial data and associated metadata is retrieved from BIDT tags defined on one or more industrial devices, where the BIDT tags from which the data is retrieved are referenced by the asset models that make up the plant model. In some embodiments, the BIDT data and metadata can be received from the gateway devices from which the asset models were received. At 2208, a graphical presentation of the data retrieved at step 2206 is generated based on the plant model and the metadata. The graphical presentation can organize the data in accordance with the hierarchical structure defined by the plant model.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, instrumentation, and human machine interface (HMI) that communicate via the network, which includes control, automation, and/or public networks. The PLC or automation controller can also communicate to and control various other devices such as standard or safety-rated I/O modules including analog, digital, programmed/ intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, near field communication (NFC), Bluetooth, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 23:
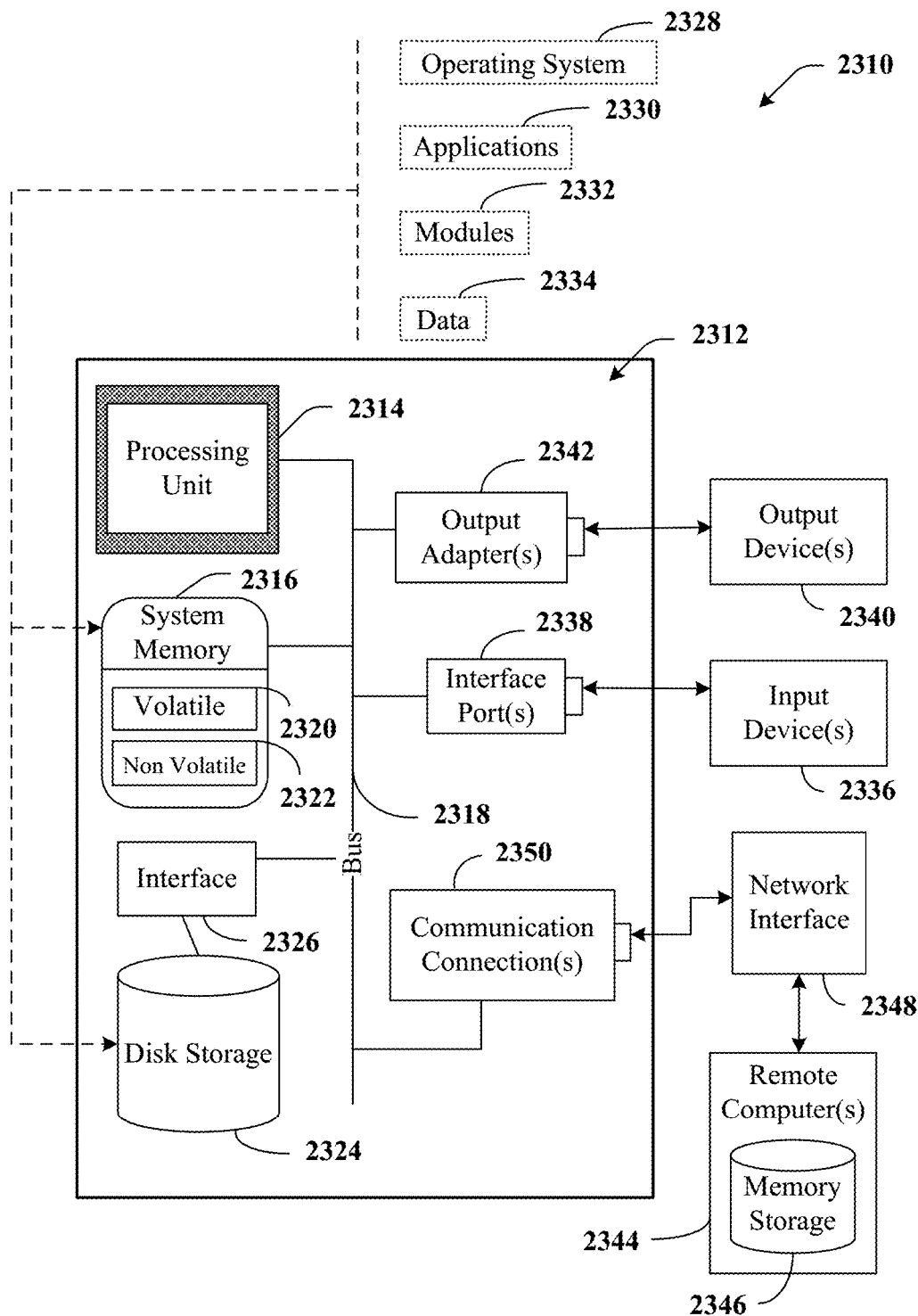
FIG. 23 is an example computing environment.
Figure 24:
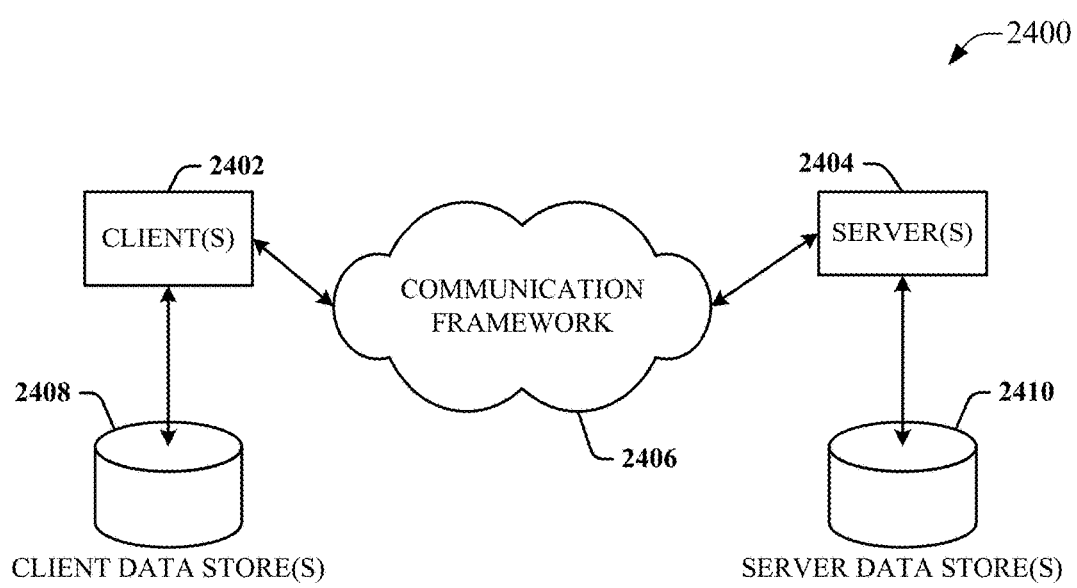
FIG. 24 is an example networking environment.

In order to provide a context for the various aspects of the disclosed subject matter, FIGS. 23 and 24 as well as the following discussion are intended to provide a brief, general description of a suitable environment in which the various aspects of the disclosed subject matter may be implemented.

With reference to FIG. 23, an example environment 2310 for implementing various aspects of the aforementioned subject matter includes a computer 2312. The computer 2312 includes a processing unit 2314, a system memory 2316, and a system bus 2318. The system bus 2318 couples system components including, but not limited to, the system memory 2316 to the processing unit 2314. The processing unit 2314 can be any of various available processors. Multi-core microprocessors and other multiprocessor architectures also can be employed as the processing unit 2314.

The system bus 2318 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 2316 includes volatile memory 2320 and nonvolatile memory 2322. The basic input/output system (BIOS), containing the basic routines to transfer information between elements within the computer 2312, such as during start-up, is stored in nonvolatile memory 2322. By way of illustration, and not limitation, nonvolatile memory 2322 can include read only memory (ROM), programmable ROM (PROM), electrically programmable ROM (EPROM), electrically erasable PROM (EEPROM), or flash memory. Volatile memory 2320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 2312 also includes removable/non-removable, volatile/non-volatile computer storage media. FIG. 23 illustrates, for example a disk storage 2324. Disk storage 2324 includes, but is not limited to, devices like a magnetic disk drive, floppy disk drive, tape drive, Jaz drive, Zip drive, LS-100 drive, flash memory card, or memory stick. In addition, disk storage 2324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2324 to the system bus 2318, a removable or non-removable interface is typically used such as interface 2326.

It is to be appreciated that FIG. 23 describes software that acts as an intermediary between users and the basic computer resources described in suitable operating environment 2310. Such software includes an operating system 2328. Operating system 2328, which can be stored on disk storage 2324, acts to control and allocate resources of the computer 2312. System applications 2330 take advantage of the management of resources by operating system 2328 through program modules 2332 and program data 2334 stored either in system memory 2316 or on disk storage 2324. It is to be appreciated that one or more embodiments of the subject disclosure can be implemented with various operating systems or combinations of operating systems.

A user enters commands or information into the computer 2312 through input device(s) 2336. Input devices 2336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2314 through the system bus 2318 via interface port(s) 2338. Interface port(s) 2338 include, for example, a serial port, a parallel port, a game port, and a universal serial bus (USB). Output device(s) 2340 use some of the same type of ports as input device(s) 2336. Thus, for example, a USB port may be used to provide input to computer 2312, and to output information from computer 2312 to an output device 2340. Output adapters 2342 are provided to illustrate that there are some output devices 2340 like monitors, speakers, and printers, among other output devices 2340, which require special adapters. The output adapters 2342 include, by way of illustration and not limitation, video and sound cards that provide a means of connection between the output device 2340 and the system bus 2318. It should be noted that other devices and/or systems of devices provide both input and output capabilities such as remote computer(s) 2344.

Computer 2312 can operate in a networked environment using logical connections to one or more remote computers, such as remote computer(s) 2344. The remote computer(s) 2344 can be a personal computer, a server, a router, a network PC, a workstation, a microprocessor based appliance, a peer device or other common network node and the like, and typically includes many or all of the elements described relative to computer 2312. For purposes of brevity, only a memory storage device 2346 is illustrated with remote computer(s) 2344. Remote computer(s) 2344 is logically connected to computer 2312 through a network interface 2348 and then physically connected via communication connection 2350. Network interface 2348 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL). Network interface 2348 can also encompass near field communication (NFC) or Bluetooth communication.

Communication connection(s) 2350 refers to the hardware/software employed to connect the network interface 2348 to the system bus 2318. While communication connection 2350 is shown for illustrative clarity inside computer 2312, it can also be external to computer 2312. The hardware/software necessary for connection to the network interface 2348 includes, for exemplary purposes only, internal and external technologies such as, modems including regular telephone grade modems, cable modems and DSL modems, ISDN adapters, and Ethernet cards.

FIG. 24 is a schematic block diagram of a sample computing environment 2400 with which the disclosed subject matter can interact. The sample computing environment 2400 includes one or more client(s) 2402. The client(s) 2402 can be hardware and/or software (e.g., threads, processes, computing devices). The sample computing environment 2400 also includes one or more server(s) 2404. The server(s) 2404 can also be hardware and/or software (e.g., threads, processes, computing devices). The servers 2404 can house threads to perform transformations by employing one or more embodiments as described herein, for example. One possible communication between a client 2402 and servers 2404 can be in the form of a data packet adapted to be transmitted between two or more computer processes. The sample computing environment 2400 includes a communication framework 2406 that can be employed to facilitate communications between the client(s) 2402 and the server(s) 2404. The client(s) 2402 are operably connected to one or more client data store(s) 2408 that can be employed to store information local to the client(s) 2402. Similarly, the server(s) 2404 are operably connected to one or more server data store(s) 2410 that can be employed to store information local to the servers 2404.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system for presenting industrial data, comprising:
a memory that stores executable components;
a processor, operatively coupled to the memory, that executes the executable components, the executable components comprising:
a model configuration component configured to define, based on model configuration input data, an asset model that defines one or more industrial assets in terms of hierarchical elements, wherein
the asset model references data tags defined on an industrial device that respectively conform to one of a set of basic information data types,
the data tags are stored on the industrial device and each data tag of the data tags comprises a field for storing a current value of the data tag and one or more metadata fields that store user-defined metadata for the data tag, the one or more metadata fields specific to a basic information data type of the data tag, and
the set of basic information data types comprise at least a state data type comprising a first metadata field defining names of available states associated with an industrial asset of the one or more industrial assets, a rate data type comprising a second metadata field defining a maximum value of a rate associated with the industrial asset, an odometer data type comprising a third metadata field defining a rollover value of a cumulative quantity associated with the industrial asset, and an event data type comprising a fourth metadata field defining one or more event names of an instantaneous event or a persistent event associated with the industrial asset;
a discovery component configured to discover the data tags defined on the industrial device and to retrieve industrial data and the user-defined metadata associated with the data tags from the industrial device; and
a presentation component configured to generate a graphical presentation of the industrial data that is formatted in accordance with the asset model and the user-defined metadata.

2. The system of claim 1, wherein the asset model comprises multiple hierarchical levels defined by the model configuration input data, and the hierarchical elements of the asset model represent at least one of a plant facility, a production area, a production line, a production cell, a production station, a machine, an industrial asset, a unit of equipment, or an industrial device.

3. The system of claim 2, wherein the asset model assigns groups of the data tags defined on the industrial device to respective hierarchical elements of the hierarchical elements.

4. The system of claim 2, wherein the presentation component is configured to generate the graphical presentation to include a hierarchical navigation menu having a hierarchical structure defined by the asset model.

5. The system of claim 1, wherein the state data type represents a current state of the available states associated with the industrial asset and further comprises a fifth metadata field that defines identities of one or more data tags that determine the current state of the available states.

6. The system of claim 1, wherein the rate data type represents the rate associated with the industrial asset and further comprises a fifth metadata field that defines at least one of a minimum value of the rate, identities of one or more data tags that determine a value of the rate, or a unit of measure for the rate.

7. The system of claim 1, wherein the odometer data type represents the cumulative quantity associated with the industrial asset and further comprises a fifth metadata field defining at least one of identities of one or more data tags that determine the cumulative quantity, a definition of a time interval over which the cumulative quantity is tracked, or a unit of measure for the cumulative quantity.

8. The system of claim 1, wherein the event data type represents the instantaneous event or the persistent event associated with the industrial asset and further comprises a fifth metadata field defining identities of one or more data tags that determine the instantaneous event or the persistent event.

9. The system of claim 1, wherein
the presentation component is further configured to, for a data tag of the data tags defined on the industrial device, select a graphical element, of a set of defined graphical elements, with which to render industrial data associated with the data tag on the graphical presentation, and
the graphical element is selected based on a determination of which of the set of basic information data types is associated with the data tag defined on the industrial device.

10. The system of claim 1, further comprising an application server interface component configured to send the asset model, the industrial data, and the user-defined metadata to an application server system configured to aggregate multiple asset models, including the asset model, into an aggregated plant model.

11. A method, comprising:
defining, on a system comprising a processor based on configuration input data, an asset model that defines one or more industrial assets in terms of hierarchical elements, wherein the asset model references data tags stored on an industrial device that respectively conform to a basic information data type of a set of basic information data types, each data tag of the data tags stored on the industrial device comprises a field that stores a current value of the data tag and one or more metadata fields that store user-defined metadata for the data tag, and the set of basic information data types comprise at least
a state data type comprising a first metadata field defining names of available states associated with an industrial asset of the one or more industrial assets,
a rate data type comprising a second metadata field defining a maximum value of a rate associated with the industrial asset,
an odometer data type comprising a third metadata field defining a rollover value of a cumulative quantity associated with the industrial asset, and
an event data type comprising a fourth metadata field defining one or more event names of an instantaneous event or a persistent event associated with the industrial asset;
discovering, by the system, the data tags stored on the industrial device;
retrieving, by the system from the industrial device, industrial data and user-defined metadata associated with the data tags; and
generating, by the system, a graphical display of the industrial data, wherein the generating comprises formatting the graphical display based on the asset model and the user-defined metadata.

12. The method of claim 11, wherein the defining the asset model comprises defining at least one of the hierarchical elements to represent at least one of a plant facility, a production area, a production line, a production cell, a production station, a machine, an industrial asset, a unit of equipment, or an industrial device.

13. The method of claim 12, wherein the defining the asset model comprises assigning groups of the data tags stored on the industrial device to respective hierarchical elements of the hierarchical elements.

14. The method of claim 12, wherein the generating the graphical display comprises generating the graphical display to include a hierarchical navigation menu having a hierarchical structure defined by the asset model.

15. The method of claim 11, wherein
the retrieving comprises retrieving a subset of the industrial data and a subset of the user-defined metadata from one of the data tags stored on the industrial device and conforming to the state data type,
the subset of the industrial data retrieved from the one of the data tags represents a current state of the available states associated with the industrial asset, and
the subset of the user-defined metadata retrieved from the one of the data tags defines at least the names of the available states stored in the first metadata field and identities of one or more data tags that determine the current state of the available states, the identities of the one or more data tags retrieved from a fifth metadata field of the rate data type.

16. The method of claim 11, wherein
the retrieving comprises retrieving a subset of the industrial data and a subset of the user-defined metadata from one of the data tags stored on the industrial device and conforming to the rate data type,
the subset of the industrial data retrieved from the one of the data tags represents the rate associated with the industrial asset, and
the subset of the user-defined metadata retrieved from the one of the data tags comprises at least one of the maximum value of the rate retrieved from the second metadata field, a minimum value of the rate retrieved from a fifth metadata field of the rate data type, identities of one or more data tags that determine the rate retrieved from a sixth metadata field of the rate data type, or a unit of measure for the rate retrieved from a seventh metadata field of the rate data type.

17. The method of claim 11, wherein
the retrieving comprises retrieving a subset of the industrial data and a subset of the user-defined metadata from one of the data tags stored on the industrial device and conforming to the odometer data type,
the subset of the industrial data retrieved from the one of the data tags represents the cumulative quantity associated with the industrial asset, and
the subset of the user-defined metadata retrieved from the one of the data tags comprises at least one of the rollover value of the cumulative quantity retrieved from the third metadata field, identities of one or more data tags that determine the cumulative quantity retrieved from a fifth metadata field of the odometer data type, a definition of a time interval over which the cumulative quantity is tracked retrieved from a sixth metadata field of the odometer data type, or a unit of measure for the cumulative quantity retrieved from a seventh metadata field of the odometer data type.

18. The method of claim 11, wherein
the retrieving comprises retrieving a subset of the industrial data and a subset of the user-defined metadata from one of the data tags stored on the industrial device and conforming to the event data type,
the subset of the industrial data retrieved from the one of the data tags represents the instantaneous event or the persistent event associated with the industrial asset, and
the subset of the user-defined metadata retrieved from the one of the data tags comprises at least one of the one or more event names retrieved from the fourth metadata field or identities of one or more data tags that determine the instantaneous event or the persistent event retrieved from a fifth metadata field of the event data type.

19. A non-transitory computer-readable medium having stored thereon instructions that, in response to execution, cause a system comprising a processor to perform operations, the operations comprising:
defining, based on configuration input data, an asset model that defines one or more industrial assets in terms of hierarchical elements, wherein the asset model references data tags stored on an industrial device that respectively conform to a basic information data type of a set of basic information data types, each data tag of the data tags stored on the industrial device comprises a field that stores a current value of the data tag and one or more metadata fields that store user-defined metadata for the data tag, and the set of basic information data types comprise at least
a state data type comprising a first metadata field defining names of available states associated with an industrial asset of the one or more industrial assets,
a rate data type comprising a second metadata field defining a maximum value of a rate associated with the industrial asset,
an odometer data type comprising a third metadata field defining a rollover value of a cumulative quantity associated with the industrial asset, and
an event data type comprising a fourth metadata field defining one or more event names of an instantaneous event or a persistent event associated with the industrial asset;
discovering the data tags stored on the industrial device;
retrieving, from the industrial device, industrial data and user-defined metadata associated with the data tags; and
generating a graphical display of the industrial data, wherein the generating comprises formatting the graphical display based on the asset model and the user-defined metadata.

20. The non-transitory computer-readable medium of claim 19, wherein the generating the graphical display comprises generating the graphical display to include a hierarchical navigation menu having a hierarchical structure defined by the asset model.

* * * * *